United States Patent [19]
Watanabe et al.

[11] Patent Number: 6,089,811
[45] Date of Patent: Jul. 18, 2000

[54] PRODUCTION LINE WORKFLOW AND PARTS TRANSPORT ARRANGEMENT

[75] Inventors: Kazuhiro Watanabe; Mineo Watashiro, both of Kawasaki; Masaru Kitano; Yuichiro Ohta, both of Yonago; Hideo Ishii, Kawasaki; Katsuyuki Miyazaki, Kawasaki; Mikio Fujii, Kawasaki, all of Japan

[73] Assignee: Fujitsu Limited, Kawasaki, Japan

[21] Appl. No.: 09/350,169

[22] Filed: Jul. 9, 1999

[30] Foreign Application Priority Data

Dec. 25, 1998 [JP] Japan .................................. 10-371421
Mar. 19, 1999 [JP] Japan .................................. 11-076699

[51] Int. Cl.⁷ .............................. H01L 21/02; B65G 1/04
[52] U.S. Cl. .......................... 414/269; 414/277; 414/281; 198/347.3; 198/347.4
[58] Field of Search ..................... 414/267, 268, 414/269, 270, 271, 272, 273, 274, 275, 277–286; 198/347.1, 347.2, 347.3, 347.4, 367, 367.1, 367.2

[56] References Cited

U.S. PATENT DOCUMENTS

| | | | |
|---|---|---|---|
| 2,412,137 | 12/1946 | Fink | 414/271 X |
| 3,144,926 | 8/1964 | Edelman | 414/271 X |
| 3,490,616 | 1/1970 | Cstaldi | 414/273 |
| 3,613,910 | 10/1971 | Weir | 414/281 |
| 3,863,777 | 2/1975 | Murata | 414/282 |
| 4,189,273 | 2/1980 | Soderstrom et al. | 198/367 X |
| 5,125,782 | 6/1992 | Goldschmidt et al. | 414/278 X |
| 5,564,879 | 10/1996 | Noguchi | 414/268 |

FOREIGN PATENT DOCUMENTS 7-44614  2/1995  Japan .
9-260226 10/1997  Japan .

*Primary Examiner*—Robert P. Olszewski
*Assistant Examiner*—Gerald J. O'Connor
*Attorney, Agent, or Firm*—Armstrong, Westerman, Hattori, McLeland & Naughton

[57] ABSTRACT

A plurality of subsidiary transport paths are disposed crossing a main transport path, for transferring a workpiece. A stocker is disposed at each cross point between the main transport path and each of the subsidiary transport paths. The stocker transfers the workpiece to and from the main transport path and a corresponding subsidiary transport path and temporarily stocks the workpiece. A plurality of processing apparatuses are disposed corresponding to each of the subsidiary transport paths. The processing apparatus receives the workpiece transported on a corresponding subsidiary transport path, processes it, and returns it to the corresponding subsidiary transport path. An efficient transport as a whole can be realized.

38 Claims, 17 Drawing Sheets

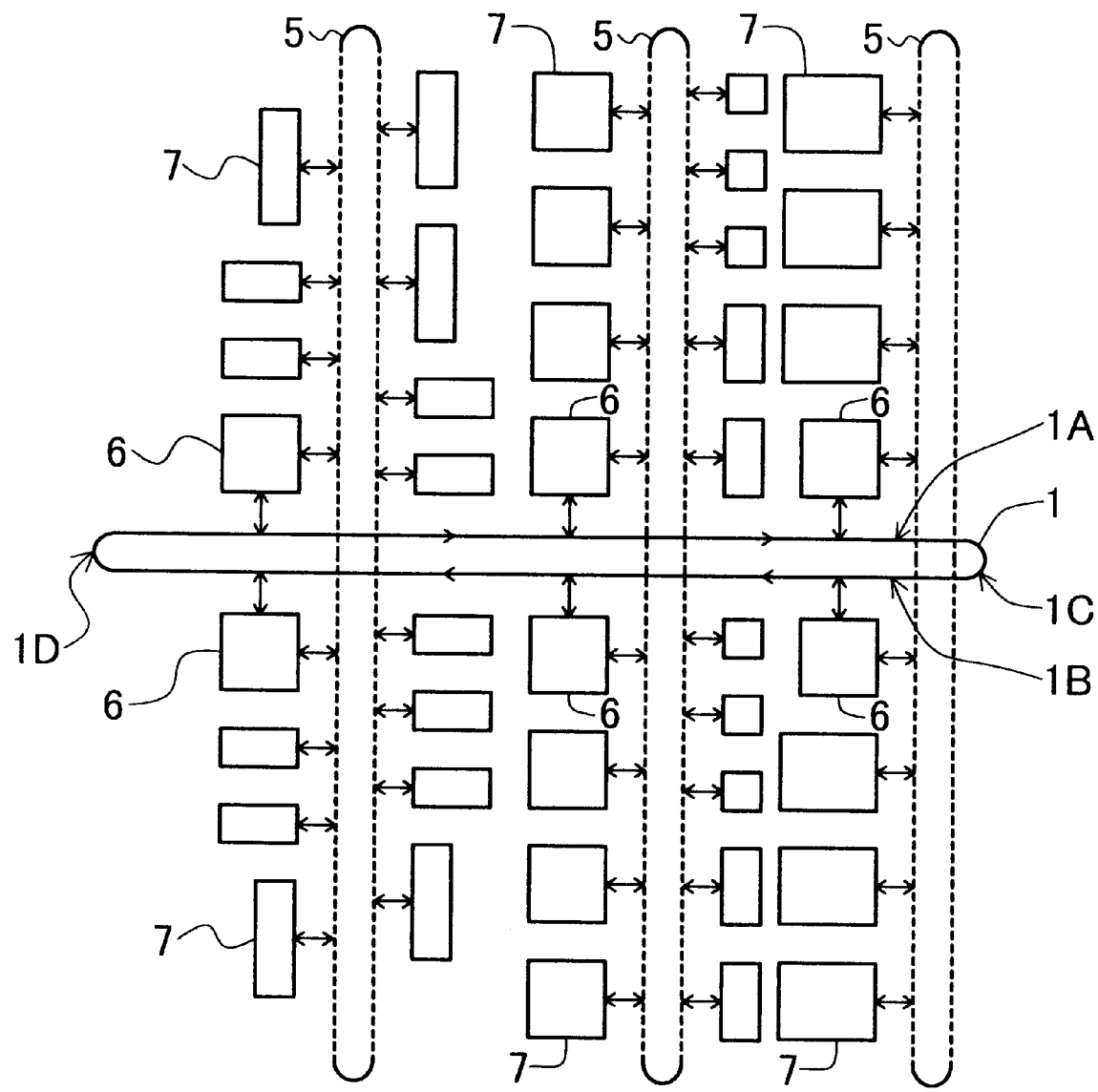

6,089,811

PRODUCTION LINE WORKFLOW AND PARTS TRANSPORT ARRANGEMENT

This application is based on Japanese Patent Applications HEI 10-371421, filed on Dec. 15, 1998 and HEI 11-76699, filed on Mar. 19, 1999, the entire contents of which are incorporated herein by reference.

BACKGROUND OF THE INVENTION a) Field of the Invention

The present invention relates to a transport apparatus, method and system suitable for production lines of semiconductor devices and liquid crystal display devices.

b) Description of the Related Art

Most of production lines for semiconductor devices and liquid crystal display devices adopt a job shop production style which manages as one unit an apparatus group constituted of processing apparatuses having the same function or a large apparatus group constituted of apparatus groups. A plurality of apparatuses in each apparatus group and annexed loaders and unloaders are housed in each partitioned small room called a bay.

FIG. 17A is a plan view showing a layout of a conventional transport apparatus 20 which forms production lines of semiconductor devices. A main transport path 200 extending in a lateral direction in FIG. 17A is set in a generally central portion of the transport apparatus. Subsidiary transport paths 201 branch from the main transport path 200 at a plurality of predetermined positions of the main transport path 200. The subsidiary transport paths 201 are disposed on both sides of the main transport path 200. When attention is paid to one subsidiary transport path 201, this path 201 is disposed only on one side of the main transport path 200. One subsidiary path 201 corresponds to one bay. The subsidiary transport path is also called an intra-bay transport path. The main transport path 200 and subsidiary transport paths 201 transport a workpiece such as a wafer cassette.

A stocker 202 is provided for each subsidiary transport path 201. The stocker 202 transports a workpiece between the main transport path 200 and corresponding subsidiary transport path 201 and also temporarily stocks a workpiece. In order to transport a workpiece from one bay to another bay, the workpiece is transferred from the stocker 202 at the transport originating bay via the main transport path 200 to the stocker 202 of the transport destination bay. Namely, if a workpiece is transported from one bay to another bay, the main transport path 200 is used. The main transport path 200 is therefore called an inter-bay transport path.

Predetermined processing apparatuses 203 are disposed around the subsidiary transport path 201. Each processing apparatus receives a workpiece under transport on the subsidiary transport path 201 and executes a predetermined process to thereafter return the workpiece to the subsidiary transport path 201.

FIG. 17B is a plan view showing another layout of a conventional transport apparatus. In this example shown in FIG. 17B, subsidiary transports paths 201 are disposed only on one side of a main transport path 200. The other structures are the same as those shown in FIG. 17A. The transport apparatus shown in FIG. 17A follows a both-side bay system, and the transport apparatus shown in FIG. 17B follows a one-side bay system.

In determining a transport destination of a workpiece in one bay, a processing apparatus group which executes the next process for the workpiece is determined and then the stocker of the bay housing the determined processing group is determined as the transport destination.

In the transport apparatus, there are a plurality of workpieces to be processed at different process sequences. In order to process a workpiece having different process sequences, each processing apparatus is required to perform a process sequence switching work. For example, in the case of an exposure system, a work such as exchanging a photomask is required to be performed. In order to reduce a loss in the process sequence switching work, it is preferable to schedule the process sequence so that workpieces can be processed continuously by the same process. To this end, a plurality of workpieces which can be processed by the same process are stocked in the stocker 202 so that the workpieces capable of being processed by the same process can be supplied continuously.

It is necessary to supply a collection of workpieces to be processed by the same process to a processing apparatus which performs a batch process of processing a plurality of workpieces at the same time. Also to this end, it is necessary for the stocker 202 to stock a plurality of workpieces capable of being processed by the same process. The stocker 202 therefore stocks a plurality of workpieces to be processed at different process sequences, a set of workpieces to be processed by the same process being stocked separately.

In the transport apparatus of the both-side bay system shown in FIG. 17A, an average distance between the stocker 202 and processing apparatuses 203 in the bay is short so that a transport time in the bay can be made short. Since the subsidiary transport paths 201 are disposed on both sides of the main transport path 200, a number of connection points between the main path 200 and subsidiary transport path 201 can be provided. It is therefore easy to stepwise increase the number of bays. However, since the number of bays increases, a total transport distance including inter-bay transport is likely to become long. Particularly, the number of transfers between the main transport path 200 and subsidiary transport path 201 is likely to increase.

In the transport apparatus of the one-side bay system shown in FIG. 17B, it is possible to shorten the total transport distance including inter-bay transport and to reduce the number of transfers between the main transport path 200 and subsidiary transport path 201. However, an average transport distance in each bay is long. It is difficult to provide a number of connection points between the main transport path 200 and subsidiary transport path 201, so that this one-side bay system is not suitable for stepwise increasing the number of bays.

Also in the transport apparatuses shown in FIGS. 17A and 17B, if the stocker 202 is full of workpieces or is defective, a workpiece processed at one bay cannot be transported to the stocker 202 of another bay where the next process is performed. In order to deal with such a case, a method has been incorporated in which a temporary stocker for temporarily stocking a workpiece is defined to transfer the workpiece unable to be transported, to a desired bay. With this method, however, the number of transports for temporary stock increases. In addition, the temporary stocker may become full of workpieces unable to be transported so that workpieces to be stocked essentially in this stocker cannot be stocked.

The main path 200 and subsidiary transport path 201 shown in FIGS. 17A and 17B can be realized, for example, by a ceiling transport apparatus of the type that containers move on a rail mounted on a ceiling or by an unmanned ground transport truck running on a rail mounted on the ground. With this structure, it becomes necessary to independently provide for each processing apparatus a space for temporarily stocking workpieces such as semiconductor devices and liquid crystal display devices and a space for a loader/unloader to transfer a workpiece between the transport path and processing apparatus.

As a workpiece becomes large, the stock facility and loader/unloader also become large. Therefore, the area of a necessary clean room becomes large. As the processing apparatus becomes large, the transport path becomes long so that the number of necessary containers or unmanned trucks constituting the transport path increases.

A workpiece processed by a processing apparatus at one bay is transported to the next processing apparatus at another bay via the subsidiary transport path, a stocker, the transport path, another stocker, and another subsidiary transport path. Therefore, each processing apparatus is required to independently manage a cleanness degree.

SUMMARY OF THE INVENTION

It is an object of the present invention to provide a transport apparatus capable of transporting workpieces with a high total efficiency.

According to one aspect of the present invention, there is provided a transport apparatus comprising: a first main transport path for transporting a workpiece; a plurality of first subsidiary transport paths disposed crossing the first main transport path, the first subsidiary transport path transporting the workpiece; a first stocker disposed at each cross point between the first main transport path and each of the first subsidiary transport paths, the first stocker transferring the workpiece to and from the first main transport path and a corresponding first subsidiary transport path and temporarily stocking the workpiece; and a plurality of first processing apparatuses disposed corresponding to each of the first subsidiary transport paths, the first processing apparatus receiving the workpiece transported on a corresponding first subsidiary transport path, processing the workpiece, and returning the workpiece to the corresponding first subsidiary transport path.

Since the subsidiary transport paths cross the main transport path, an average transport distance on the subsidiary transport path can be shortened more than the case wherein the workpiece is transferred to and from the main transport path at the end of the subsidiary transport path.

BRIEF DESCRIPTION OF THE DRAWINGS

FIG. 1 is a plan view showing a layout of a transport apparatus according to a first embodiment of the invention.

DETAILED DESCRIPTION OF THE PREFERRED EMBODIMENTS

Figure 2A:
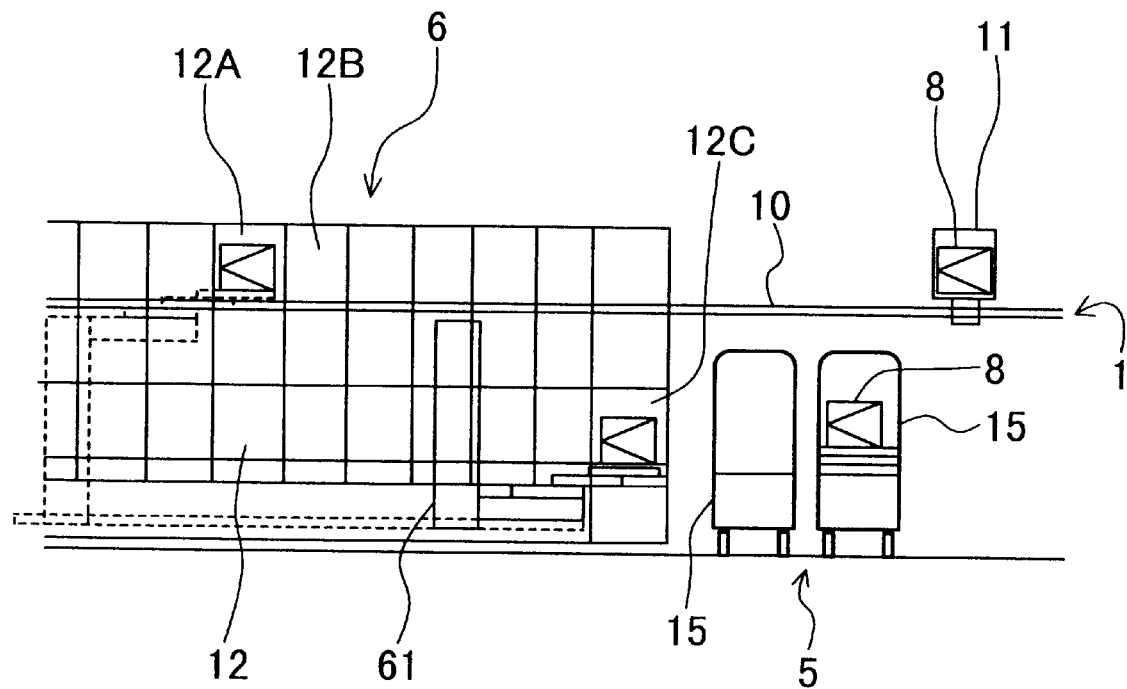
FIGS. 2A and 2B are a schematic front view and a plan view of the transport apparatus of the first embodiment.

FIG. 1 is a plan view showing a layout of a transport apparatus according to a first embodiment of the invention. A main transport path 1 extending in a lateral direction in FIG. 1 is set in a generally central portion of an area where the transport apparatus is disposed. The main transport path 1 includes an outward path 1A, a return path 1B disposed generally parallel to the outward path 1A, a first curved path 1C interconnecting the end of the outward path 1A and the start of the return path 1B, and a second curved path 1D interconnecting the end of the return path 1B and the start of the outward path 1A. The main transport path 1 is therefore a closed loop transport path.

A plurality of subsidiary transport paths 5 are disposed crossing the main transport path 1. Similar to the main transport path 1, each subsidiary transport path 5 is a closed loop transport path. The main transport path 1 and subsidiary transport paths 5 transport workpieces. When semiconductor devices are manufactured, a cassette accommodating semiconductor substrates as workpieces is used, and when liquid crystal display devices are manufactured, a cassette accommodating glass substrates as workpieces is used.

At each cross point between the main transport path 1 and each subsidiary transport path 5, two stockers 6 are disposed. The stocker 6 transfers a workpiece between the main transport path 1 and corresponding subsidiary transport path 5, and also temporarily stocks workpieces. Three or more stockers may be disposed at each subsidiary transport path 5.

A plurality of processing apparatuses 7 are disposed around each subsidiary transport path 5. The processing apparatus 7 receives a workpiece transported on the subsidiary transport path 5, processes it, and returns it to the subsidiary transport path 5. Examples of the processing apparatus 7 include a chemical vapor deposition (CVD) system, an ion implanter system, an exposure system, a heat treatment system and the like.

Figure 2B:
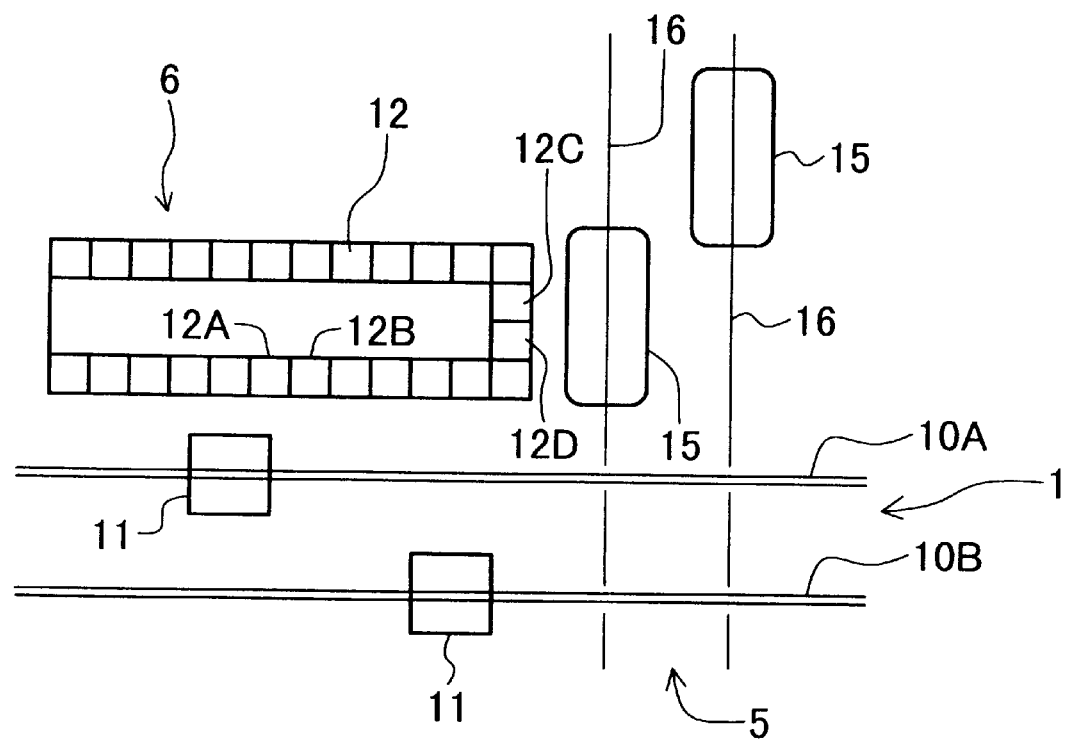

FIG. 2A is a front view showing the stocker 6, main transport path 1 and subsidiary transport path 5 of the transport apparatus of the first embodiment, and FIG. 2B is a plan view thereof. The main transport path 1 is constituted of a linear motor rail 10 and containers 11. The rail 10 includes an outward rail 10A and a return rail 10B which are mounted on the ceiling of a room in which the transport apparatus is accommodated. The container 11 is guided by the rail 10 and moved by a linear motor. Workpieces 8 to be processed are housed in each container 11.

The subsidiary transport path 5 is constituted of a virtual rail 16 and a railless ground truck 15 moving along the virtual rail 16. The railless truck 15 transports workpieces 8 housed therein.

The stocker 6 is constituted of a housing generally of a solid shape and a crane 61 mounted therein. A number of stock shelves 12 for stocking workpieces are formed on the side wall of the housing. An in-stock port 12A and an out-stock port 12B are formed on a partial area of the side wall facing the rail 10. Another in-stock port 12C and another out-stock port 12D are formed on a partial area of the side wall facing the virtual rail 16.

Workpieces transported in by the container 11 are transferred to the in-stock 12B by a robot arm or the like. Workpieces in the out-stock port 12A are transferred to a vacant container 11 by a robot arm or the like. Workpieces transported by the truck 15 are transferred to the in-stock port 12C by a robot arm mounted on the truck 15. Workpieces stocked in the out-stock port 12D are transferred to a vacant truck 15 by the robot arm. The crane 61 transfers workpieces between the in-stock ports 12A and 12C, out-stock ports 12B and 12D and stock shelves 12.

Figure 3:
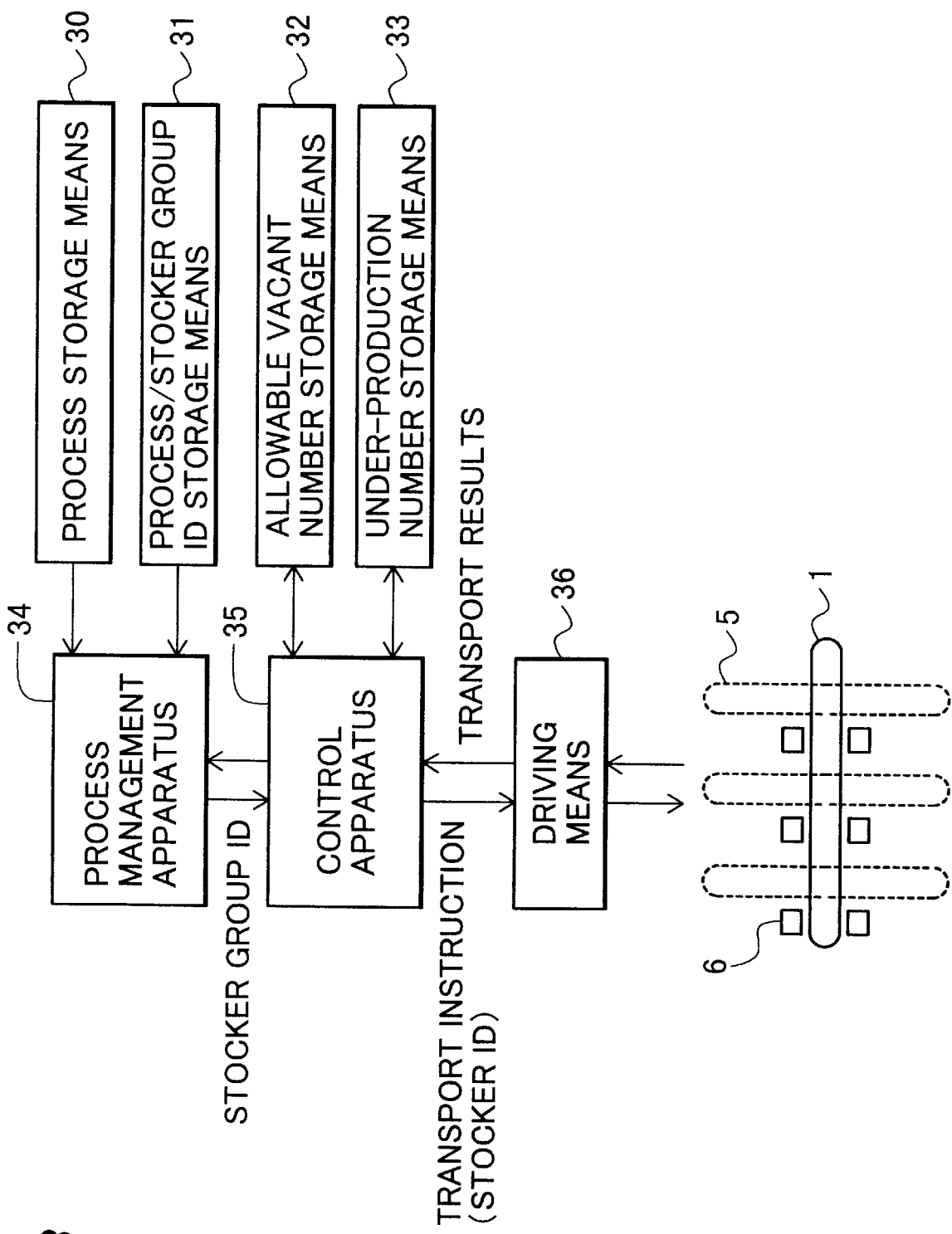
FIG. 3 is a block diagram illustrating a production management method using the transport apparatus of the first embodiment.

FIG. 3 is a block diagram showing a management system for the transport apparatus of the first embodiment. The management system manages a plurality of stockers 6 belonging to the same subsidiary transport path 5, i.e., the same bay, by using one stocker group ID. A process storage means 30 stores the order of processes for each workpiece. A process/stocker group ID storage means 31 stores a correspondence between each process and the stocker group ID corresponding to the bay where the process is executed.

An allowable vacant number storage means 32 stores for each stocker group an allowable vacant number which is obtained by subtracting the number of workpieces not in stock from the number of workpieces capable of being stocked in stockers belonging to each stocker group. An under-production number storage means 33 stores for each bay an under-production number which is a sum of the number of workpieces under transport on the subsidiary transport path 5 of each bay and the number of workpieces in the processing apparatuses 7 connected to the subsidiary transport path 5.

A process management apparatus 34 determines the next process of a workpiece in accordance with information stored in the process storage means 30, and identifies the stocker group ID of the bay where the next process is executed in accordance with information stored in the process/stocker group ID storage means 31. The identified stocker group ID is supplied to a control apparatus 35.

The control apparatus 35 judges whether the workpiece is to be transported or temporarily stored in the present stocker, in accordance the stocker group ID at the transport destination supplied from the process management apparatus 34 and in accordance with information stored in the allowable vacant number storage means 32. For example, if the allowable vacant number of the stocker group at the transport destination is a reference value or smaller, the workpiece is temporarily stocked. If the workpiece is to be transported, a transport instruction signal added with a stocker ID identifying the stocker belonging to the stocker group at the transport destination is transmitted to a transport apparatus driving means 36.

Whether the workpiece is to be transported or temporarily stored may be judged by considering not only the allowable vacant number at the transport destination but also the under-production number at the transport destination bay stored in the under-production number storage means 33. A large under-production number means that there is only a small production margin in the processing apparatuses in the bay. By judging whether the workpiece is to be transported or temporarily stored in accordance with the allowable vacant number and under-production number of the stocker group at the transport destination bay, a more proper control can be made. For example, the value of the allowable vacant value subtracted by the under-production number is compared with a reference value, and if the former is equal to or smaller than the reference value, the workpiece is temporarily stocked.

In response to the transport instruction signal, the driving means 36 drives the main transport path 1, subsidiary transport path 5 and stocker 6. The results of the transport are returned to the control apparatus 35. In accordance with the transport results, the control apparatus 35 updates the storage contents of the allowable vacant number storage means 32 and under-production number storage means 33.

Figure 17A:
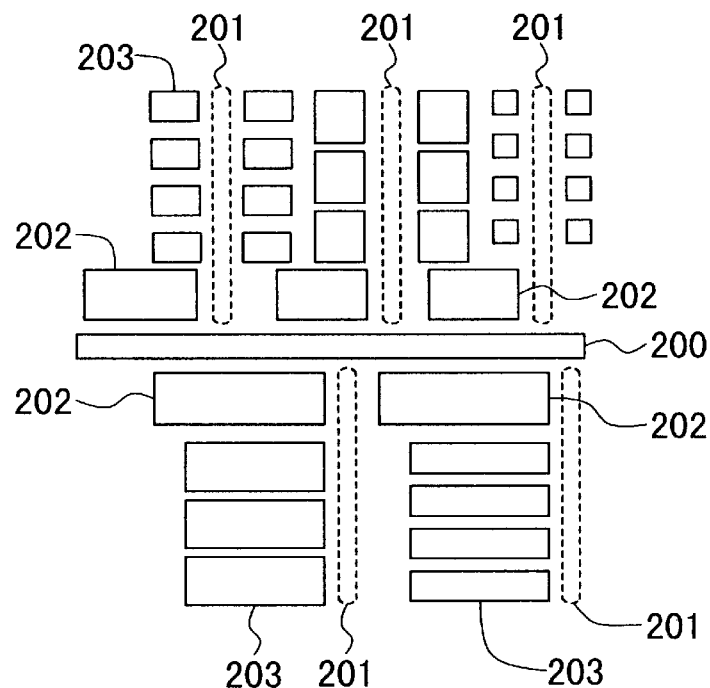
FIGS. 17A and 17B are plan views showing a conventional transport apparatus.
Figure 17B:
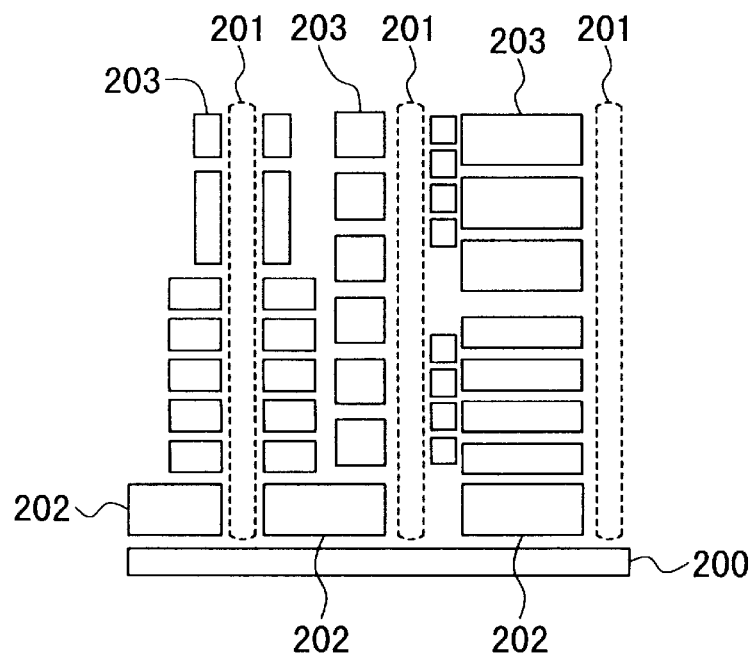

In the first embodiment, as shown in FIG. 1, the subsidiary transport paths 5 are disposed crossing the main transport path 1. Therefore, an average transport distance of a workpiece on the subsidiary transport path 5 becomes shorter than that of the one-side bay system shown in FIG. 17B in which a workpiece is transferred to the main transport path 1 at the end of the subsidiary transport path 5. The inter-bay transport amount can be reduced more than the both-side bay system shown in FIG. 17A.

Also in the first embodiment, each of the subsidiary transport paths 5 is provided with two stockers 6. Therefore, even if one stocker is stopped by accidents or the like or is full of workpieces, a workpiece can be transported to the other stocker, allowing an inter-bay transport without any trouble.

Figure 4:
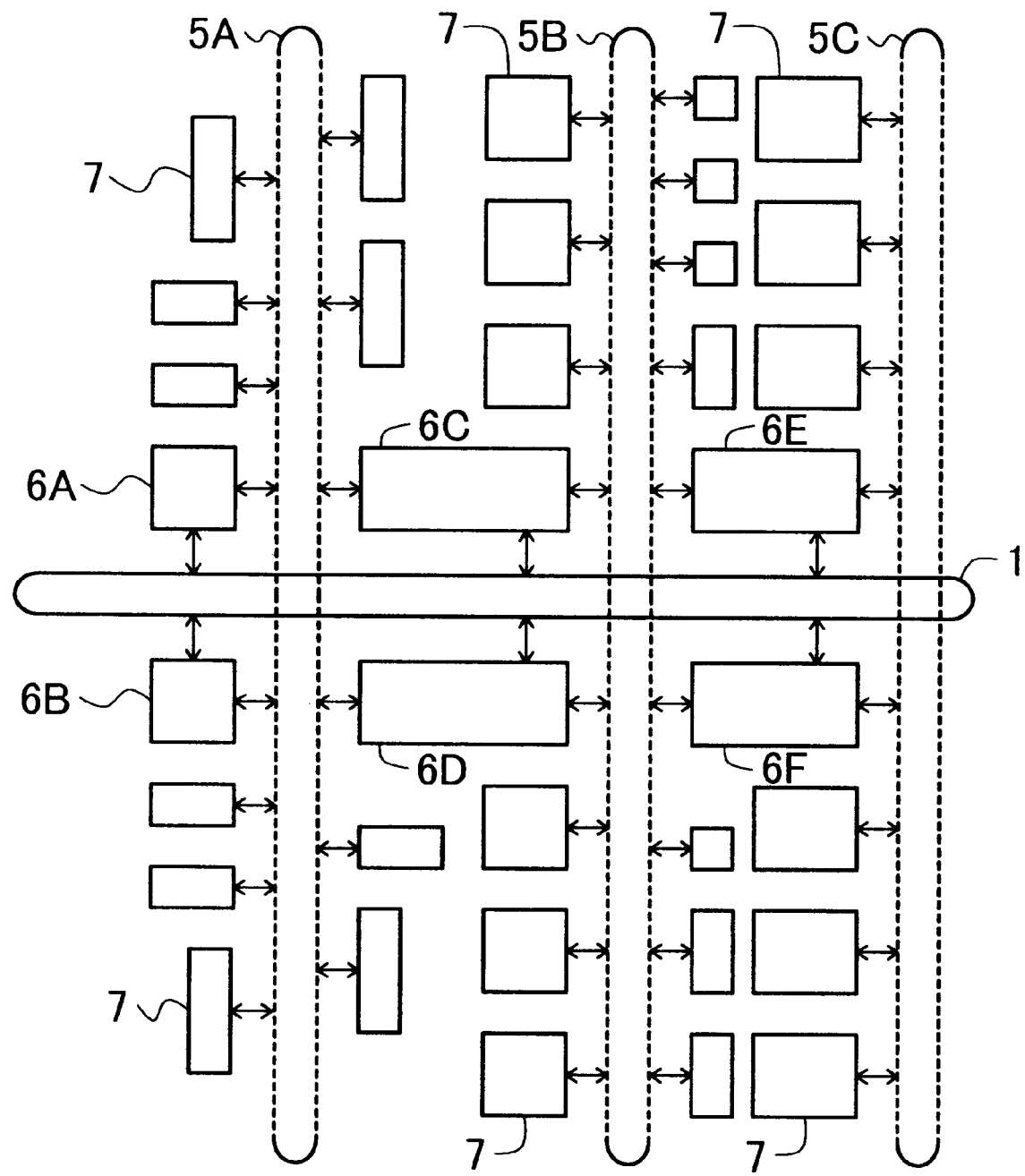
FIG. 4 is a plan view showing a layout of a transport apparatus according to a second embodiment of the invention.

FIG. 4 is a plan view showing a layout of a transport apparatus according to a second embodiment. In the first embodiment shown in FIG. 1, one stocker 6 transfers a workpiece only to one subsidiary transport path 5. In the second embodiment, one stocker 6 can transfer a workpiece to two subsidiary transport paths 5. For example, as shown in FIG. 4, two stockers 6C and 6D disposed on the left side of a central subsidiary transport path 5B can transfer a workpiece not only to the central subsidiary transport path 5B but also to a left side subsidiary transport path 5A. Two stockers 6E and 6F disposed on the left side of a rightmost subsidiary transport path 5C can transfer a workpiece also to the left side subsidiary transport path 5B. The other structures are the same as those of the first embodiment.

The stockers capable of transferring a workpiece to two subsidiary transport paths belong to two stocker groups. For example, the central stockers 6C and 6D belong to the stocker group assigned the central subsidiary transport path 5B and to the stocker group assigned the leftmost subsidiary transport path 5A.

In the second embodiment, even if the under-production number of one bay increases, if the under-production number of the adjacent bay is small, most of the stock shelves of the stocker belonging to the two bays can be assigned to the bay with the increased under-production number. It is therefore possible to make uniform the use frequencies of stock shelves.

The number of stockers 6 assignable to one bay substantially increases. It is therefore possible to relax concentration of workpieces upon one stocker even if the other stocker 6 stops by accidents.

Also in the second embodiment, a workpiece can be transported from one bay to another bay via the stocker 6 capable of transferring the workpiece between the two bays. It is therefore possible to reduce a load on the main transport path 1.

Next, the prediction results of the number of transports of a workpiece per hour will be described when the same manufacture processes are executed by using the transport apparatus of the second embodiment and a conventional transport apparatus.

Figure 5A:
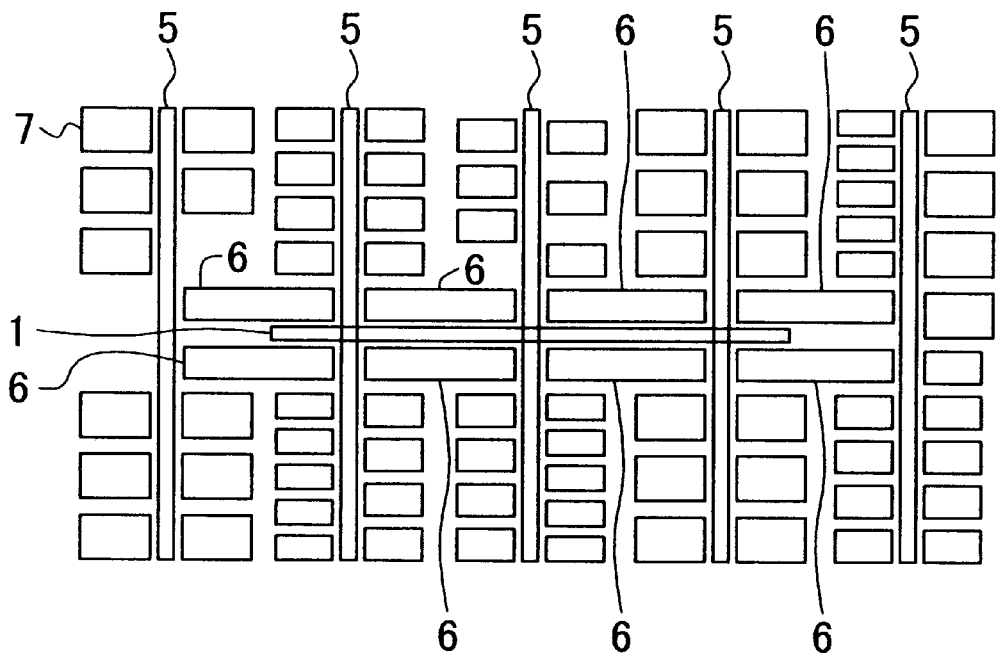
FIG. 5A is a plan view showing a layout of the transport apparatus of the second embodiment and FIG. 5B is a plan view showing a layout of a conventional transport apparatus of a both-side bay system.

FIG. 5A is a plan view showing a layout of the transport apparatus of the second embodiment used for prediction. The number of bays is five. Opposite bays shown in FIG. 5A are each assigned two stockers 6, and the other bays are assigned four stockers 6.

Figure 5B:
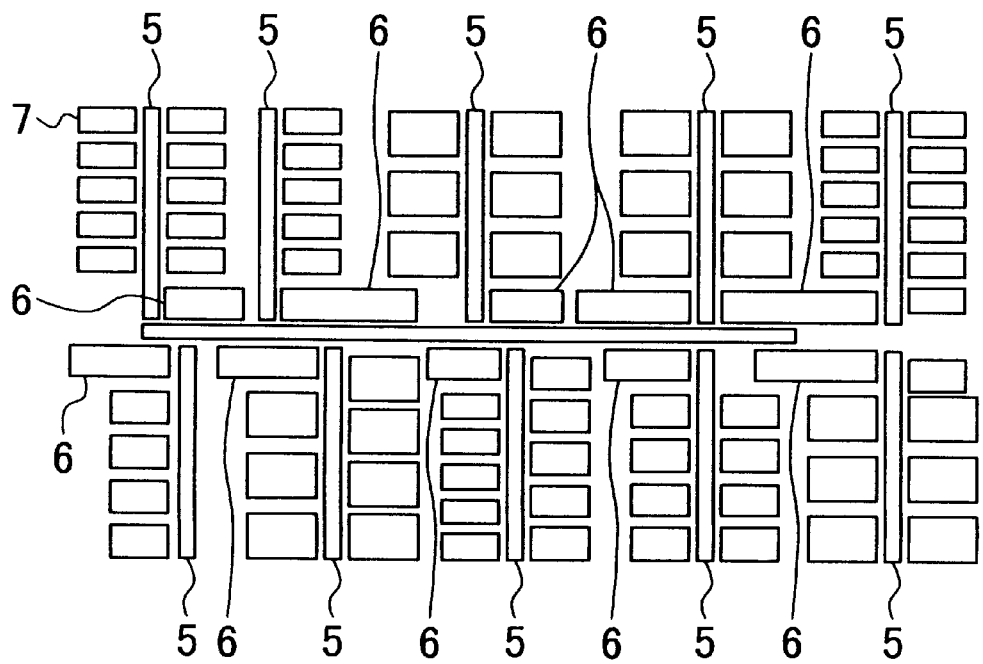

FIG. 5B is a plan view showing a layout of a conventional transport apparatus of the both-side bay system used for prediction. The number of bays is ten. Each bay is assigned one stocker 6.

The number of inter-bay transports via the main transport path 1 was twenty seven in the second embodiment apparatus, whereas that was one hundred and twelve in the conventional apparatus. The number of inter-bay transports via the stocker 6 was forty three in the second embodiment apparatus. The number of transports of the workpiece by the crane in the stocker 6 was seventy six in the second embodiment, whereas that was one hundred and eighty one in the conventional apparatus. The number of intra-bay transports was two hundred and sixty three in the second embodiment apparatus, whereas that was three hundred and eight in the conventional apparatus.

The number of transports of a workpiece in the second embodiment becomes therefore smaller than that in the conventional apparatus.

The number of inter-bay transports reduces if the transport apparatus of the one-side system is used in place of the transport apparatus of the both-side bay system shown in FIG. 5B. However, the average transport distance for intra-bay transport becomes as long as about 1.5 times as compared to the second embodiment. Therefore, the average transport time also becomes as long as about 1.5 times. If a railless truck is used on the subsidiary transport path 5, it is necessary to increase the number of trucks. According to the predictions made by the inventors, if the number of trucks necessary for the transport apparatus of the second embodiment is twenty three, the number of trucks necessary for an equivalent transport apparatus of the one-side bay system is forty six. The reason why the number of necessary trucks increases by a twofold irrespective of about 1.5 times of the intra-bay average transport distance is that as the average transport distance becomes long, a use efficiency of trucks is lowered by mutual interference of trucks.

Figure 6A:
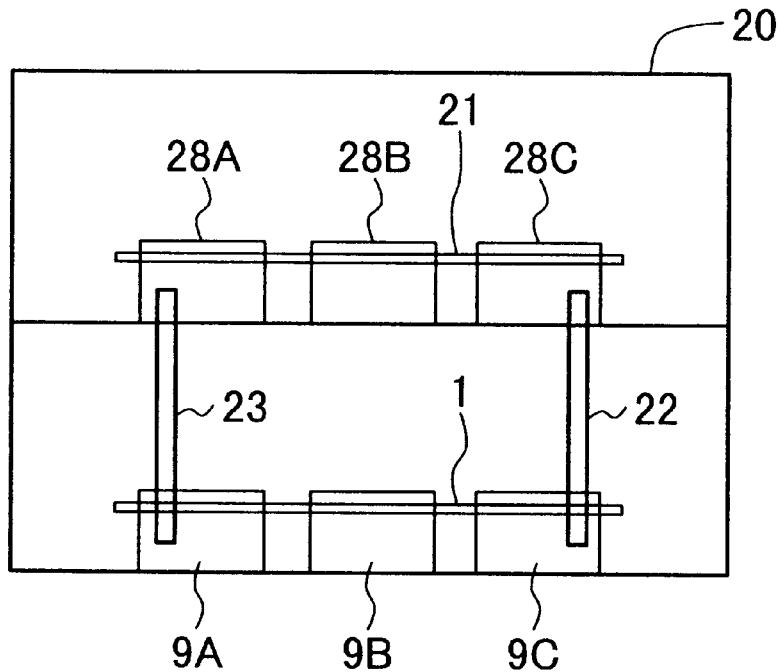
FIGS. 6A and 6B are schematic front views of transport apparatuses according to a third embodiment and its modification of the present invention, respectively.

FIG. 6A is a schematic front view of a transport apparatus according to a third embodiment. A building has a plurality of floors. A first floor is installed with a first transport apparatus having a main transport path 1 and a plurality of bays 9A to 9C. A second floor is installed with a second transport apparatus having a main transport path 21 and a plurality of bays 28A to 28C. Each of the bays 9A to 9C and 28A to 28C includes the subsidiary transport path 5, stocker 6 and processing apparatuses 7 of the first embodiment shown in FIG. 1.

The main transport paths 1 and 21 are disposed along virtual straight lines having opposite ends. A first inter-floor transport path 22 transports a workpiece in the stocker allocated to the bay 9C nearest to one end of the main transport path 1, to the stocker allocated to the bay 28C nearest to one end of the main transport path 21. A second inter-floor transport path 23 transports a workpiece in the stocker allocated to the bay 28A nearest to one end of the main transport path 21, to the stocker allocated to the bay 9A nearest to one end of the main transport path 1.

The bays 9A to 9C on the first floor are disposed in the order of device manufacture processes. The bays of 28C to 28A on the second floor are disposed in the order of manufacture processes following the process at the bay 9C. A workpiece processed at the bays 9A and 9B and then at the bay 9C is transported via the first inter-floor transport path 22 to the bay 28C. The workpiece transported to and processed at the bay 28C is processed at the bays 28B and 28A in this order and transported via the second inter-floor transport path 23 to the bay 9A.

For example, at the bays 9A to 9C and 28C to 28A, processes of washing, film formation, photolithography, etching, resist removal and inspection are executed. Starting from the process at the bay 9A and then executing the processes at the bays 9B, 9C, and 28C to 28A form one layer of a thin film.

Since a plurality of bays are disposed on a plurality of floors in the order of manufacture processes, it is possible to shorten the transport distance of a workpiece required to complete all processes.

Figure 6B:
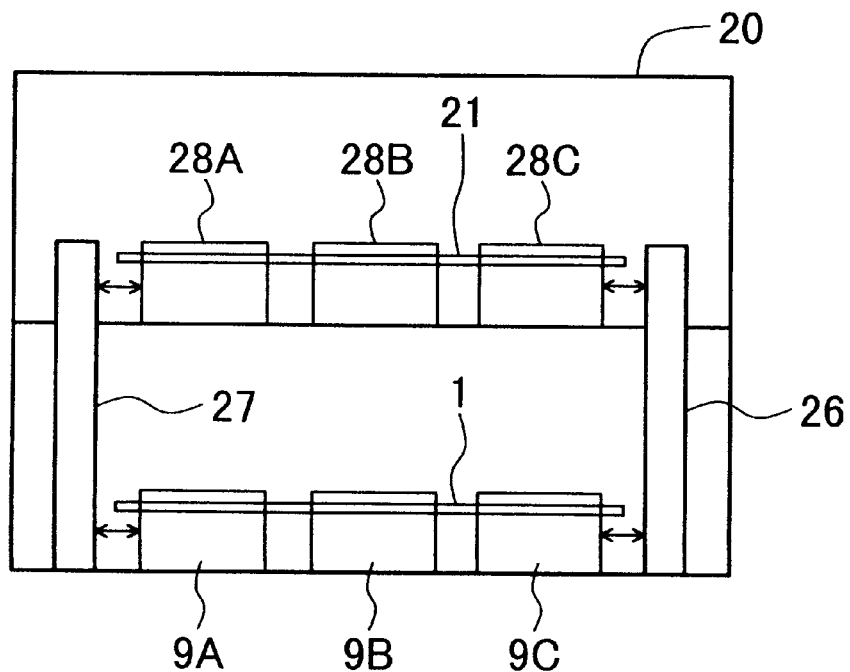

FIG. 6B is a schematic front view of a transport apparatus according to a modification of the third embodiment. Instead of the first and second inter-floor transport paths 22 and 23 shown in FIG. 6A, the transport apparatuses shown in FIG. 6B have first and second inter-floor stockers 26 and 27. The first inter-floor stocker 26 transfers a workpiece to and from a subsidiary transport path of a bay 9C and a subsidiary transport path of a bay 28C. The second inter-floor stocker 27 transfers a workpiece to and from a subsidiary transport path of a bay 9A and a subsidiary transport path of a bay 28A. The first and second inter-floor stockers 26 and 27 also stock a workpiece temporarily.

The first and second inter-floor stockers 26 and 27 can transfer a workpiece between floors. Therefore, similar to the transport apparatus shown in FIG. 6A, the transport apparatus shown in FIG. 6B can shorten the transport distance of a workpiece.

Figure 7:
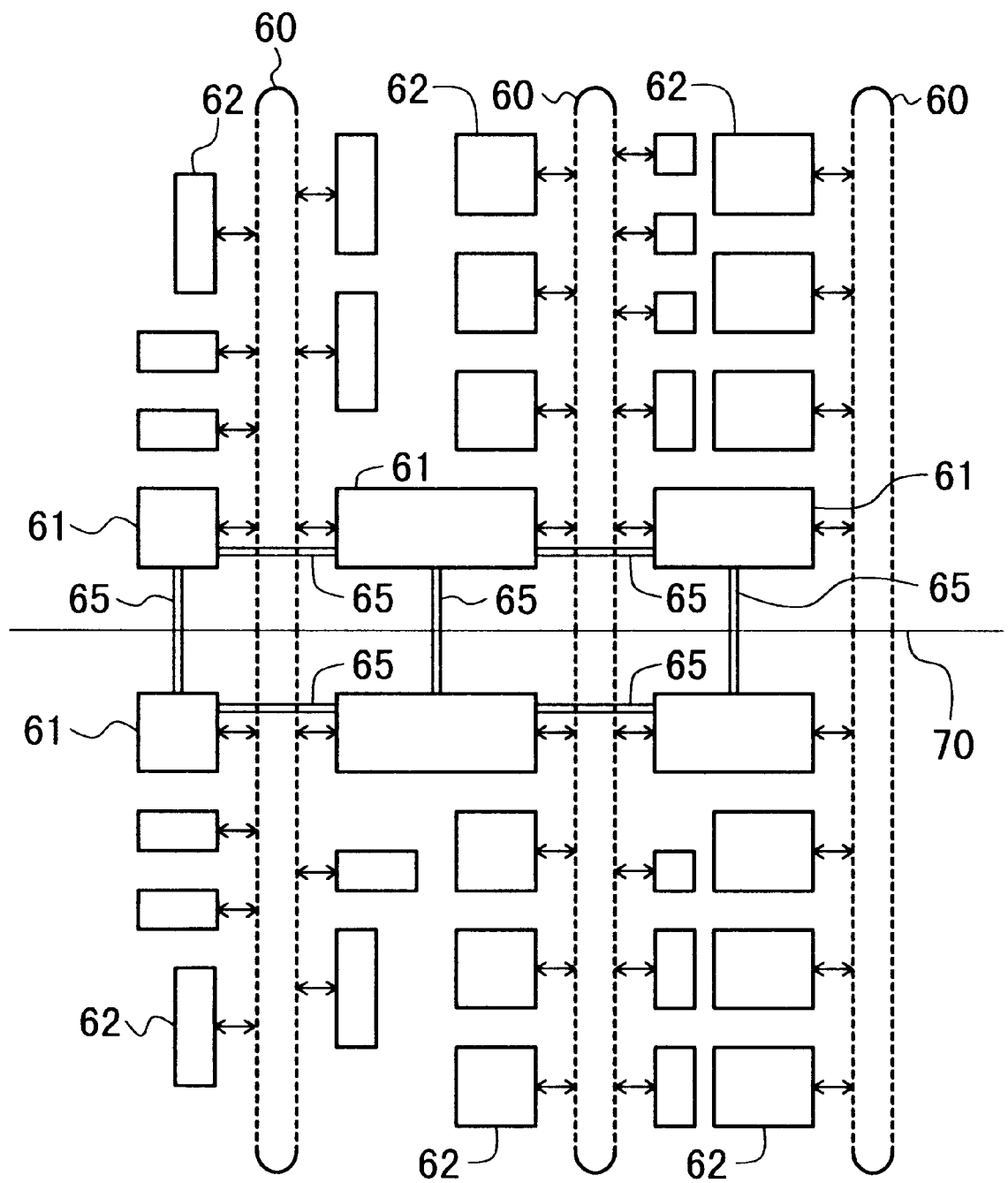
FIG. 7 is a plan view showing a layout of a transport apparatus according to a fourth embodiment of the invention.

FIG. 7 is a plan view showing a layout of a transport apparatus according to a fourth embodiment. A plurality of transport paths 60 extending in the vertical direction in FIG. 7 are disposed crossing a virtual straight line 70 extending in the horizontal direction in FIG. 7. Each transport path 60 is allocated to one bay. At least two stockers 61 are disposed for each of the transport paths 60.

The two stockers at each transport path are disposed on both sides of the virtual straight line 70. The stocker 61 transfers a workpiece to and from the corresponding transport path 60, and also stocks a workpiece temporarily. As in the case of the second embodiment shown in FIG. 4, each stocker 61 may transfer a workpiece to and from another transport path 60 adjacent to the transport path 60. A plurality of processing apparatuses 62 are disposed around each transport path 60. Each processing apparatus 62 has the function similar to that of the processing apparatus 7 shown in FIG. 1.

A connection path 65 connects an optional pair of stockers among the plurality of stockers 61. The connection path 65 transfers a workpiece between the connected two stockers 60. Each connection path 65 is disposed so that one stocker 61 can communicate with another stocker 61 via the connection path 65, transport path 60, and one or two or more of the stockers 61. Therefore, a workpiece in one stocker 61 can be transferred to another desired stocker 61 via one of the connection path 65, transport path 60 and stocker 61.

For example, the stocker 61 is disposed on both sides of the first virtual straight line 70 at each transport path 60. The connection path 65 serially connects the stocker 61 disposed on one side of the first virtual straight line 70 and serially connects the stocker 61 disposed on the other side. The connection path 65 also connects the two stockers 61 corresponding to one transport path 60 over the first virtual straight line 70. Namely, the connection path 65 forms a ladder type transport path. With this ladder type transport path, it becomes possible to form a by-pass circuit when some stocker 61 or connection path 65 becomes defective.

Figure 8:
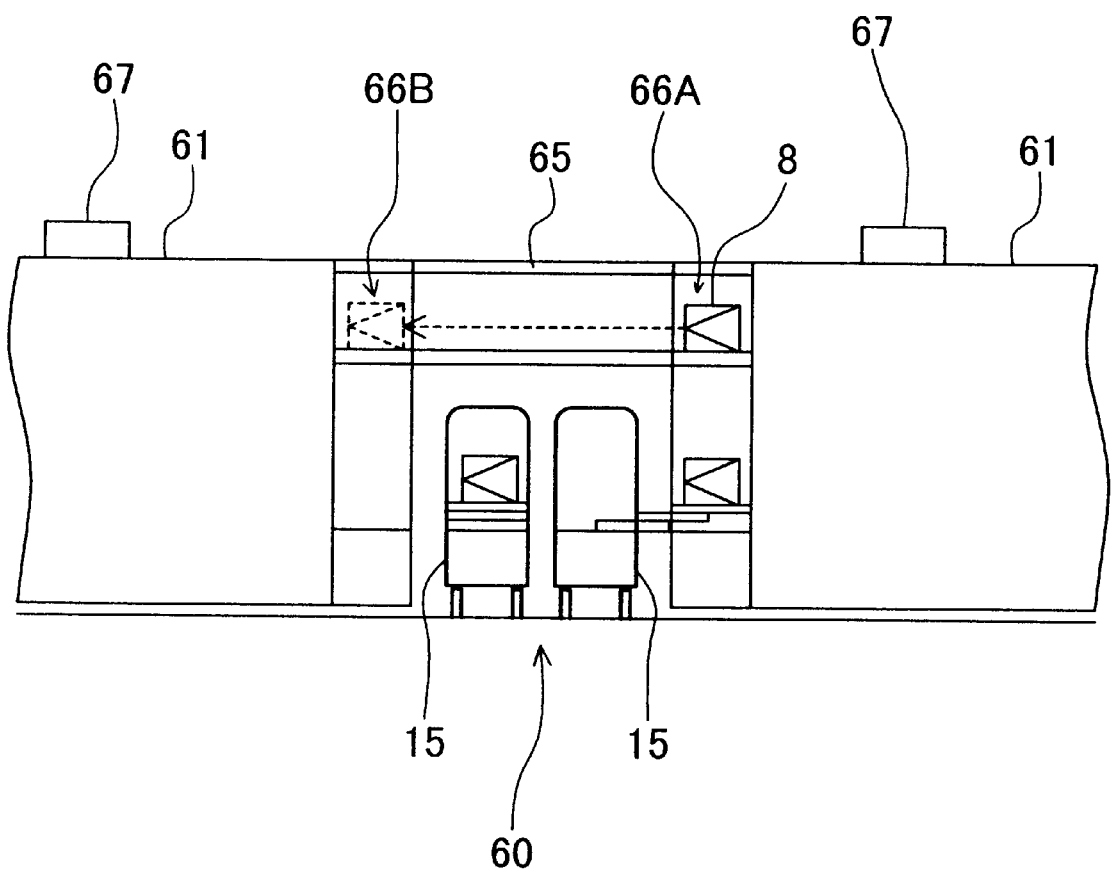
FIG. 8 is a schematic cross sectional view of a connection path of the transport apparatus of the fourth embodiment.

FIG. 8 is a cross sectional view of the connection path shown in FIG. 7. Two stockers 61 are disposed on both sides of the transport path 60. Each stocker 61 has stock shelves, similar to the stocker 6 shown in FIGS. 2A and 2B. An out-stock port 66A and an in-stock port 66B are provided in the side wall facing the transport path 60. The out-stock port 66A and the in-stock port 66B of the opposing stocker 61 are connected by the connection path 65. When the crane in the stocker 61 places a workpiece in the out-stock port 66A, the workpiece is transported to the in-stock port 66B of the opposing stocker 61 by a belt conveyer.

The inside of the connection path 65 is hermetically sealed. Each stocker 61 is installed with an air cleaner 67 to purify the inner space of the stocker 61. Since the connection path 65 has a hermetically sealed structure, the inner space of the connection path 65 is maintained to have a cleanness degree approximately equal to that of the stocker 61. A workpiece is transported only through the inner spaces of the stocker 61 and connection path 65. It is therefore possible to set the cleanness degree of the outer space lower than that of the inner space of the stocker 61.

A fifth embodiment of the invention will be described with reference to FIGS. 9 to 13.

Figure 9:
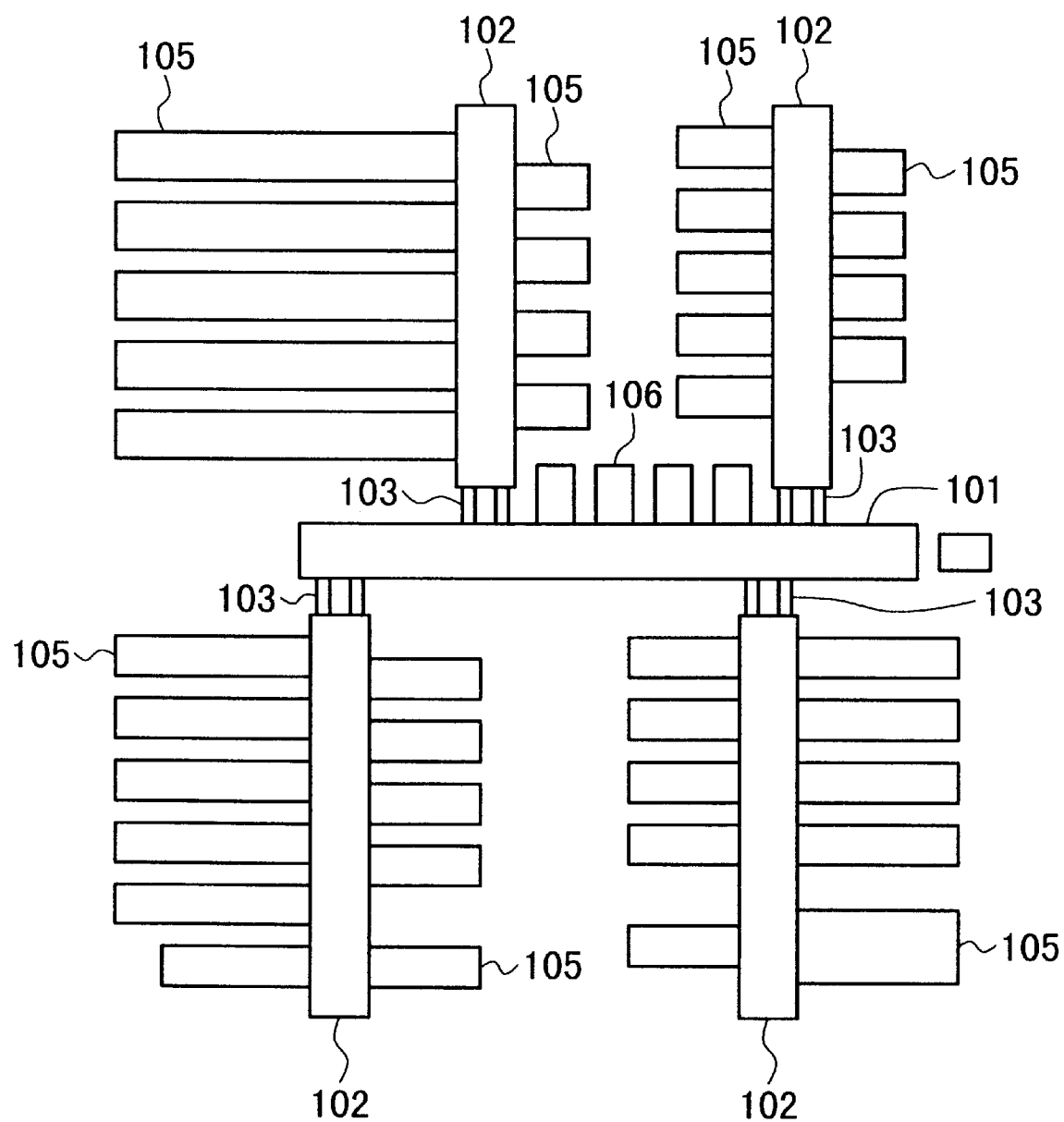
FIG. 9 is a schematic plan view of a transport apparatus according to a fifth embodiment of the invention.

FIG. 9 is a schematic diagram showing a plan layout of a transport apparatus of the fifth embodiment. A main stocker 101 is disposed in a generally central area of the transport apparatus. The main stocker 101 extends in the lateral direction in FIG. 9. A plurality of stockers 102 are disposed on both sides of the main stocker 101. Each stocker 102 extends in the vertical direction in FIG. 9. One end of each stocker 102 on the side of the main stocker 101 is connected to the side of the main stocker 101 via a connection path 103.

A plurality of processing apparatuses 105 are disposed on both sides of each stocker 102. Each processing apparatus 105 is connected to the side of the corresponding stocker 102. The processing apparatus 105 is, for example, a film forming system, an etching system, a cleaning system, a photolithography system or the like. Inspection apparatuses 106 are connected to the side of the main stocker 101.

Figure 10A:
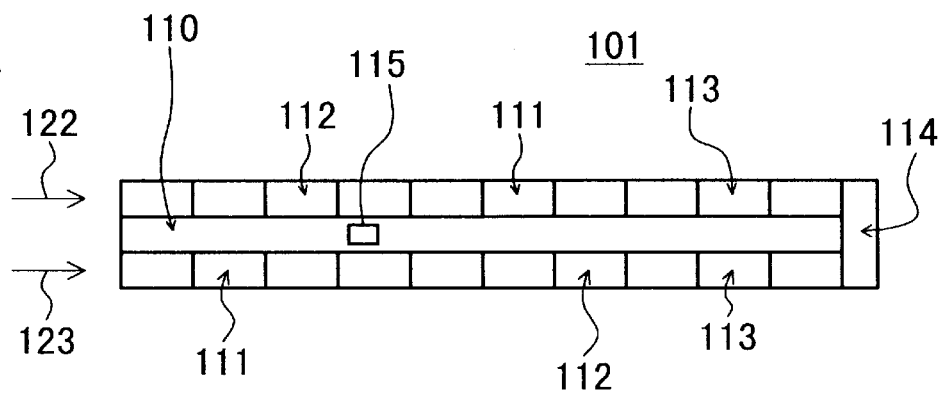
FIG. 10A is a plan view of a main stocker of the fifth embodiment.

FIG. 10A is a plan view of the main stocker 101. A crane unit 110 is installed in the central area of the main stocker 101 over the whole length. A plurality of stock-only units 111, transfer enabled units 112 and connection units 113 are disposed on both sides of the crane unit 110 along the longitudinal direction of the main stocker 101. Each of the stock-only units 111, transfer enabled units 112 and connection units 113 has the same width along the longitudinal direction. It is therefore possible to replace some unit by another unit, when necessary.

A transport vehicle connecting unit 114 is disposed at one end of the crane unit 110. A crane 115 is installed in the crane unit 110. The crane 115 moves in the crane unit 110 along its longitudinal direction to transport a workpiece.

Figure 10B:
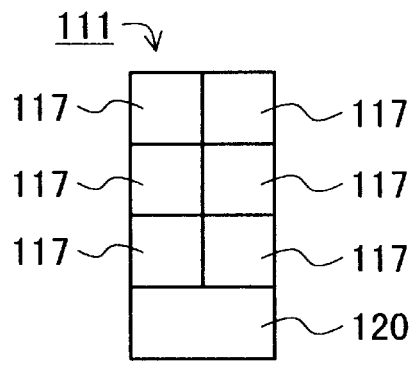
FIGS. 10B to 10D are front views of a stock-only unit, a transfer enabled unit, and a connection unit, respectively.
Figure 10C:
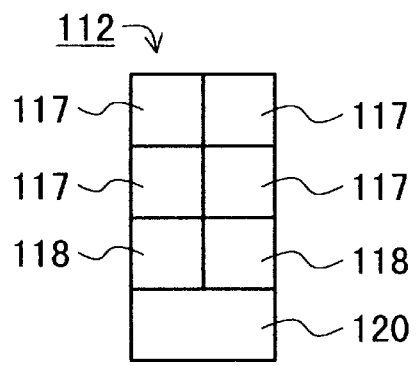
Figure 10D:
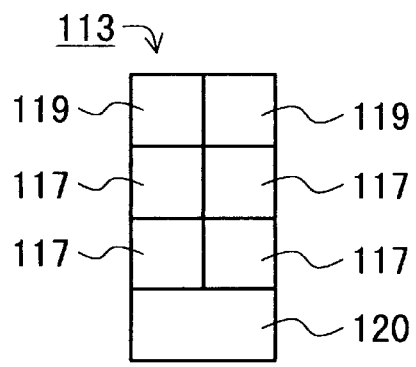

FIGS. 10B to 10D are front views of the stock-only unit 111, transfer enabled unit 112, and connection unit 113, respectively. In any of these units, an air blower housing site 120 is reserved at the lowest stage, and at the upper stages, six stock spaces of a two-column three-stage structure are reserved. Each stock space has shelves on which workpieces are placed. A partition wall is not necessary to be formed between adjacent stock spaces. An air blower is installed in the air blower housing site 120. The air blower circulates the gas in the main stocker 101. The internal circulation rate of the air is, for example, about 80%.

As shown in FIG. 10B, in the stock-only unit, all stock spaces are used as stock storage sites 117. Each stock storage site 117 stocks one workpiece. As shown in FIG. 10C, in the transfer enabled unit 1 12, the first and second stages are used as stock storage sites 117 and the third stage is used as a transfer storage site 118. A workpiece is transferred to the processing apparatus 105 or inspection apparatus 106 shown in FIG. 9 via the transfer storage site 118. As shown in FIG. 10D, in the connection unit 113, the first stage is used as an in-stock storage site 119 and the second and third stages are used as in/out-stock storage sites 117.

The stock-only units 111, transfer enabled units 112 and connection units 113 constructed as above are disposed on both sides of the crane unit 110, as shown in FIG. 10A. Therefore, some of a plurality of stock storage sites 117, transfer storage sites 118 and in/out-stock storage sites 119 are two-dimensionally disposed along a first virtual plane 122. The others of the stock storage sites 117, transfer storage sites 118 and in/out-stock storage sites 119 are two-dimensionally disposed along a second first virtual plane 122 opposite to the first virtual plane 122 relative to the crane unit 110. The surface of each of the first and second virtual planes on the side of the crane unit 110 is called a front surface, and the other surface is called a back surface.

The crane 115 transfers a workpiece to and from the stock storage site 117, transfer storage site 118 and in/out-stock storage site 119 via the front surface thereof. It is therefore possible to transfer a workpiece from an desired storage site to another desired storage site in the main stocker 101.

The stocker 102 shown in FIG. 9 has the structure similar to that of the main stocker 101 shown in FIG. 10A dismounting the transport vehicle connection unit 114. The stocker 102 is not provided with the connection unit 113, but provided with a connection unit 113a at its one end to be later described with reference to FIG. 13.

Figure 11A:
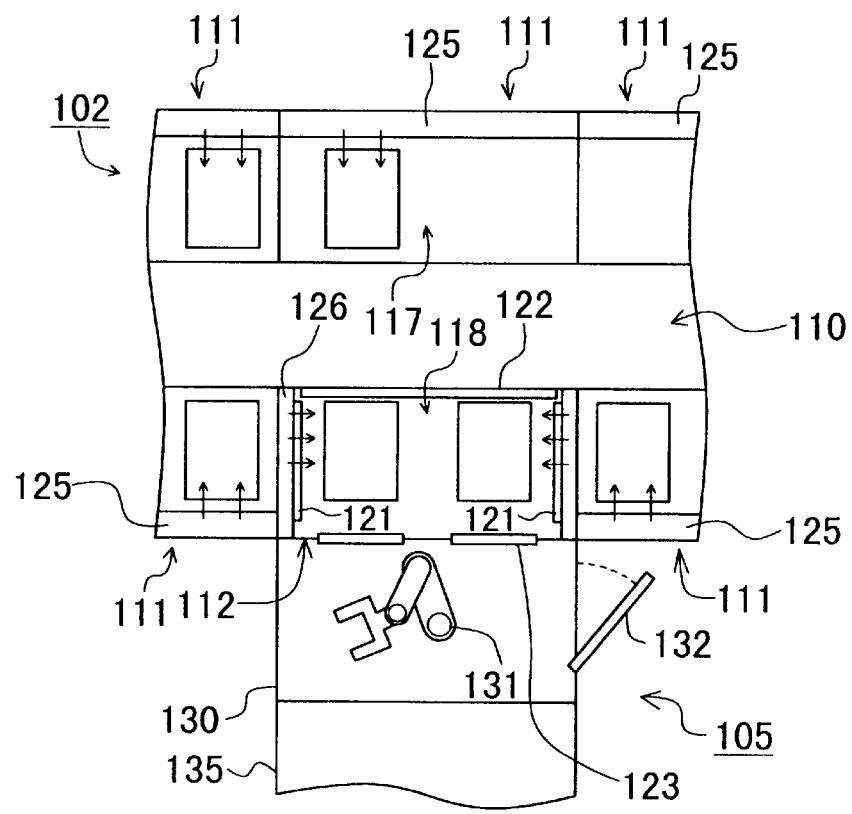
FIGS. 11A and 11B are a plan view and a lateral cross sectional view showing a connection portion between a stocker and a processing unit, respectively.

FIG. 11A is a cross sectional view in plan showing a connection area between the stocker 102 and processing apparatus 105 shown in FIG. 9. A transfer robot chamber 130 of the processing apparatus 105 is coupled to the transfer storage site 118 of the stocker 102. A shutter 122 capable of being opened and closed is disposed on the front surface side of the transfer storage site 118. As the shutter 122 is closed, the space in the transfer storage site 118 and the space in the crane unit 110 are shielded.

A shutter (separation plate) 123 capable of being opened and closed is disposed on the back surface side of the transfer storage site 118. As the shutter 123 is closed, the space in the transfer storage site 118 and the space in the transfer robot chamber 131 are shielded. A transfer robot 131 is disposed in the transfer robot chamber 130. The transfer robot 131 picks up a workpiece from the transfer storage site 118, transfers it to a processing chamber 135 of the processing apparatus 105, picks up the processed workpiece from the processing chamber 135, and returns it to the transfer storage site 118. A door 132 is mounted on the transfer robot chamber 130. Maintenance for the transfer robot 131 is performed by opening the door 132. During the maintenance for the transfer robot 131, the shutter 123 is closed so that dusts can be prevented from entering the stocker 102.

An air blowing path 125 is provided on the back surface side of the stock storage site 117. Purified gas, e.g., air, is supplied from the air blowing path 125 to the stock storage site 117. Therefore, a gas flow is formed in the stock storage site 117 from the back surface side to the front surface side. An air blowing path 126 is provided on the side surface connecting the back surface and front surface of the transfer storage site 118. Purified gas is supplied from the air blocking path 126 to the transfer storage site 118. An ionizing apparatus 121 is mounted near at the outlet of the air blowing path 126. By ionizing the gas inflowing the transfer storage site 118, electrostatic electricity accumulated on a processed workpiece can be removed. The detailed structure of these air blowing paths will be described with reference to FIG. 1B.

Figure 11B:
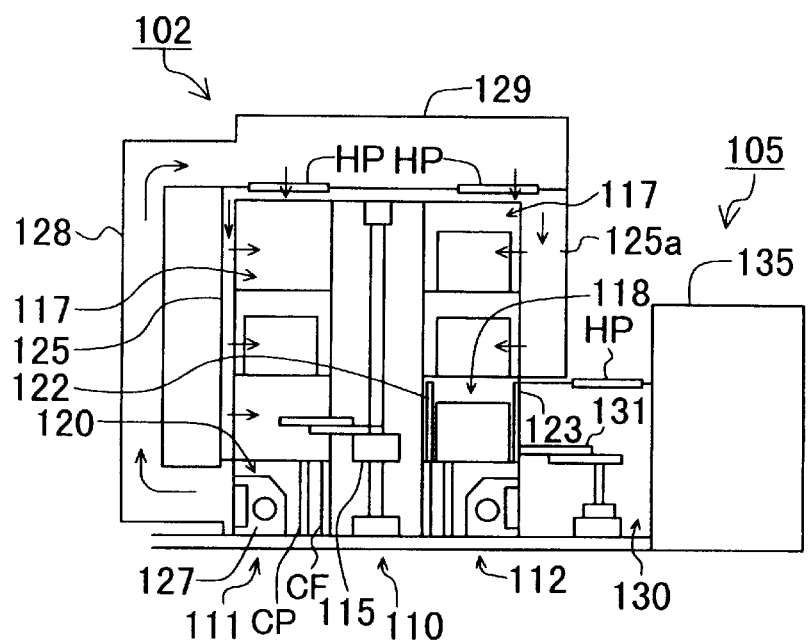

FIG. 11B is a lateral cross sectional view of the stocker 102. The stock-only unit 111and transfer enabled unit 112 are disposed on both sides of the crane unit 110. An air blower 127 is installed in the air blower housing site 120 reserved at the lowest stage of each of the stock-only unit 111 and transfer enabled unit 121.

A mixing chamber 129 is provided above the stocker 102. A return duct 128 connects an exhaust port of the air blower 127 to the mixing chamber 129. The air blower 127 sucks gas in the stocker 102 and feeds it to the return duct 128. The gas fed to the return duct 128 is transported to the mixing chamber 129.

The air blowing path 125 is mounted on the back surface side of the stock storage site 117 of the stock-only unit 111. An air blowing path 125a is mounted on the back surface side of the stock storage site 117 of the transfer enabled unit 117. The air blowing path 125a has an inner diameter larger than that of the air blowing path 125.

Gas in the mixing chamber 129 is introduced via a purifying filter (HEPA filter) into the air blowing paths 125 and 125a. The gas in the air blowing paths 125 and 125a is supplied to the stock storage site 117, and recovered by the air blower 127 via the crane unit 110. In this manner, the gas circulates in the stocker 102. The circulating gas is purified by the HEPA filter disposed at the intermediate position of the circulation path.

The end of the air blowing path 125a on the downstream side communicates with the air blowing path 126 shown in FIG. 11A. It is conceivable that a flow resistance increases at the connection portion between the air blowing paths 125a and 126. It is therefore presumed that a gas flow inflowing the stock storage site 117 above the transfer storage site 118 becomes weaker than that inflowing the other stock storage site 117. By making the air blowing path 125a have a larger inner diameter than the air blowing path 125, the strength of the gas flow can be made near uniform throughout the circulation path.

A chemical filter CF and a cooling panel CP may be disposed at the boundary between the space of the air blower housing site 120 and the space of the crane unit 110.

Gas purified by a HEPA filter HP mounted on the upper surface of the transfer robot chamber 130 is introduced into this chamber 130. In this case, the pressure in the transfer storage site 118 is controlled lower than that in the transfer robot chamber 130. With such a pressure control, dusts in the transfer robot chamber 130 can be prevented from entering the stocker 102.

The transfer robot 131 picks up a processed workpiece from the processing chamber 135 and returns it to the transfer storage site 118. The workpiece immediately after processing is likely to emit particles and chemically contaminated substances from its surface. The shutter 122 is closed when the processed workpiece is returned to the transfer storage site 118. Therefore, it is possible to prevent particles and chemically contaminated substances from flowing into the other space in the stocker 102. In this case, a gas flow is formed from the transfer storage site 118 to the transfer robot chamber 130 so that particles and chemically contaminated substances are conveyed to the transport robot chamber 130 side.

Figure 12A:
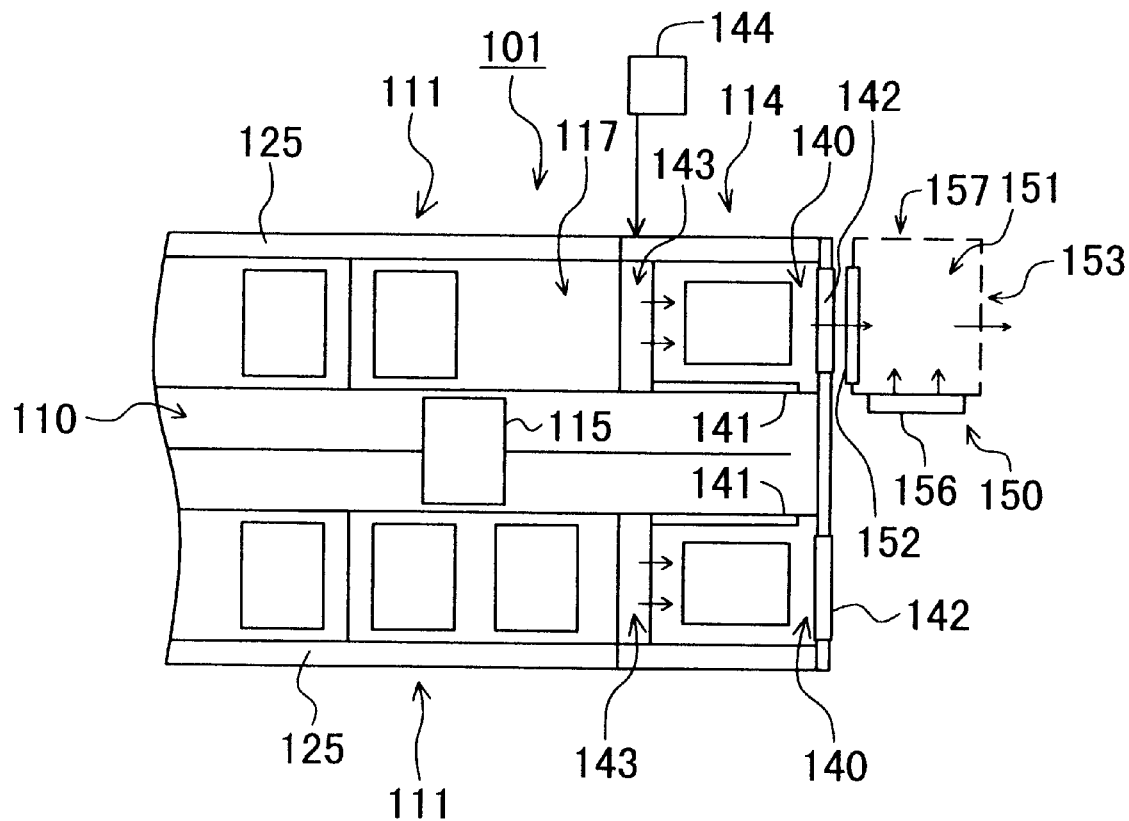
FIGS. 12A and 12B are a plan view and a front view of a transport vehicle transfer unit, respectively.
Figure 12B:
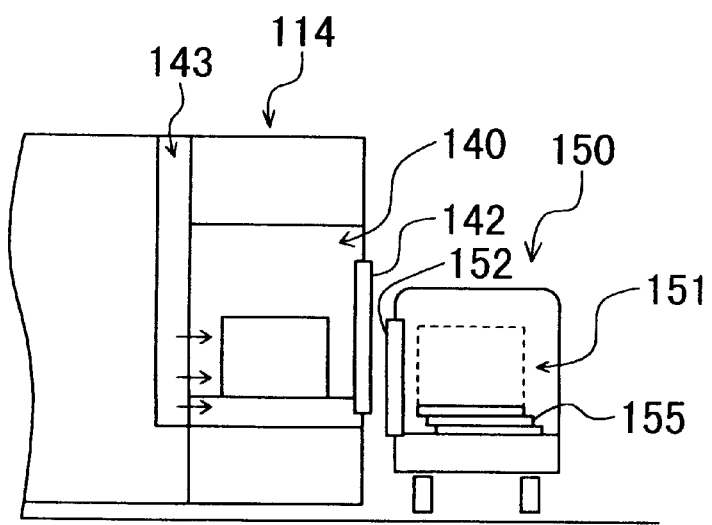

FIGS. 12A and 12B are a schematic plan view and a schematic front view of the transport vehicle connecting unit 114 shown in FIG. 1A. The transport vehicle connection unit 114 is disposed at the end of the units disposed on both sides of the crane unit 110. A transport connection storage site 140 is reserved in the transport vehicle connecting unit 114. A shutter 141 capable of being opened and closed is disposed on the front surface side of the transport connection storage site 140. By opening the shutter 141, a workpiece can be transferred between the crane 115 and transport connection storage site 140.

A transfer window 142 capable of being opened-and closed is formed in the end wall of the transport connection storage site 140. At the other end wall opposite to the transfer window 142, an air blowing path 143 is disposed. Purified gas is supplied from the air blowing path 143 to the transport connection storage site 140. A gas flow is formed from the air blowing path 143 to the transport window 142. This gas flow prevents external dusts from entering the stocker 101 when the transfer window 142 is opened.

An air blower 144 for supplying gas to the air blowing path 143 is provided separately from the air blower 127 shown in FIG. 11B for circulating gas through the stocker. Since the dedicated air blower 144 is provided, a gas flow having a sufficient gas amount can be formed in the transport connection storage site 140. It is also possible to suppress turbulence of gas circulating in the stocker 101 and maintain a sufficient inner circulation rate of gas.

When a workpiece is to be transported, a transport vehicle 150 stops at the position facing the transport window 142. A workpiece storage site 151 is reserved in the transport vehicle 150, and a transport robot 155 is installed in the workpiece storage site 151. A transport window 152 is formed in the wall of the storage site 151 facing the stocker 101. A plurality of through holes 153 are formed through the wall of the storage site 151 opposite to the transport window 152.

A gas flow is formed from the air blowing path 143, via the transport connection storage site 140, transport windows 142 and 152 and storage site 151, and via the through holes 153 to the external.

An air blowing apparatus 156 is mounted on another wall of the storage site 151 to supply purified gas into the storage site 151. A plurality of through holes 157 are formed through the opposite wall to form a gas flow from the air blowing apparatus 156 to the opposite wall.

Figure 13:
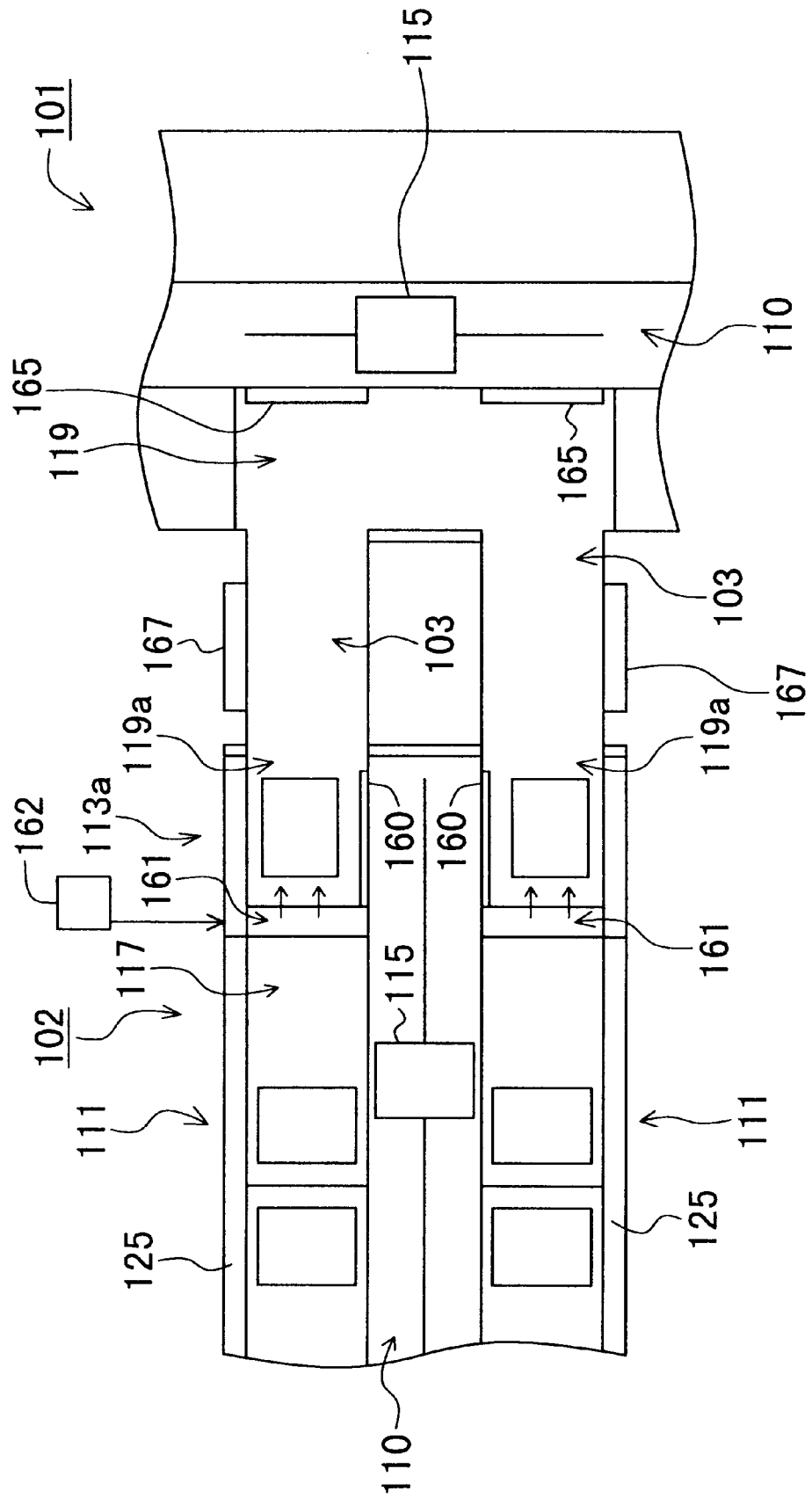
FIG. 13 is a plan view of a connection portion between the main stocker and a stocker.

FIG. 13 is a schematic plan view showing a connection portion between the main stocker 101 and stocker 102 shown in FIG. 9. The connection unit 113a is disposed at the end of the stocker 102. An in/out-stock storage site 119a is reserved in the connection unit 13a. The space of the in/out-stock storage site 119a communicates with the space of the connection path 103.

A shutter 160 capable of being opened and closed is disposed between the in/out-stock storage site 119a and crane unit 110. By opening the shutter 160, a workpiece can be transferred between the crane 115 and in/out-stock storage site 119a. An air blowing path 161 is mounted on a side wall of the in/out-stock storage site 119a. Purified gas is supplied from an air blower 162 to the in/out-stock storage site 119a via the air blowing path 161. This gas is transported to the connection path 103.

The other end of the connection path 103 is connected to the in/out-stock storage site 119 of the main stocker 101. The space of the crane unit 110 of the main stocker 101 and the space the in/out-stock storage site 119 are shielded by a shutter 165 capable of being opened and closed.

When the crane 115 of the main stocker 101 places a workpiece on the in/out-stock storage site 119, the conveyer in the connection path 103 transports it to the in/out-stock storage site 119a of the stocker 102. The connection path 103 can transport a workpiece in the opposite direction.

An air blowing path 167 is mounted on the side wall of the connection path 103. Purified gas is supplied from the air blowing path 167 to the connection path 103. The gas introduced into the connection path is exhausted, for example, through holes formed through the bottom wall thereof. If a workpiece is of a plate shape such as a liquid crystal substrate, it is preferable to make the gas flow supplied from the air blowing path 167 parallel to the substrate surface.

The pressure in the connection path 103 is controlled lower than that of the stockers 101 and 102. It is therefore possible to prevent dusts in the connection path from entering the stockers.

With the fifth embodiment, a workpiece can be transferred between a plurality of processing apparatuses only via the spaces in the stocker and connection path. Since the workpiece is not exposed to an atmosphere different from that in the stocker and connection path, contamination of the workpiece can be avoided. Further, since the space whose cleanness degree is managed is limited only to the spaces of the stocker and connection path, management of the cleanness degree is easy. Still further, since a dedicated transport path is not necessary, the space of the transport apparatus can be reduced.

Figure 14:
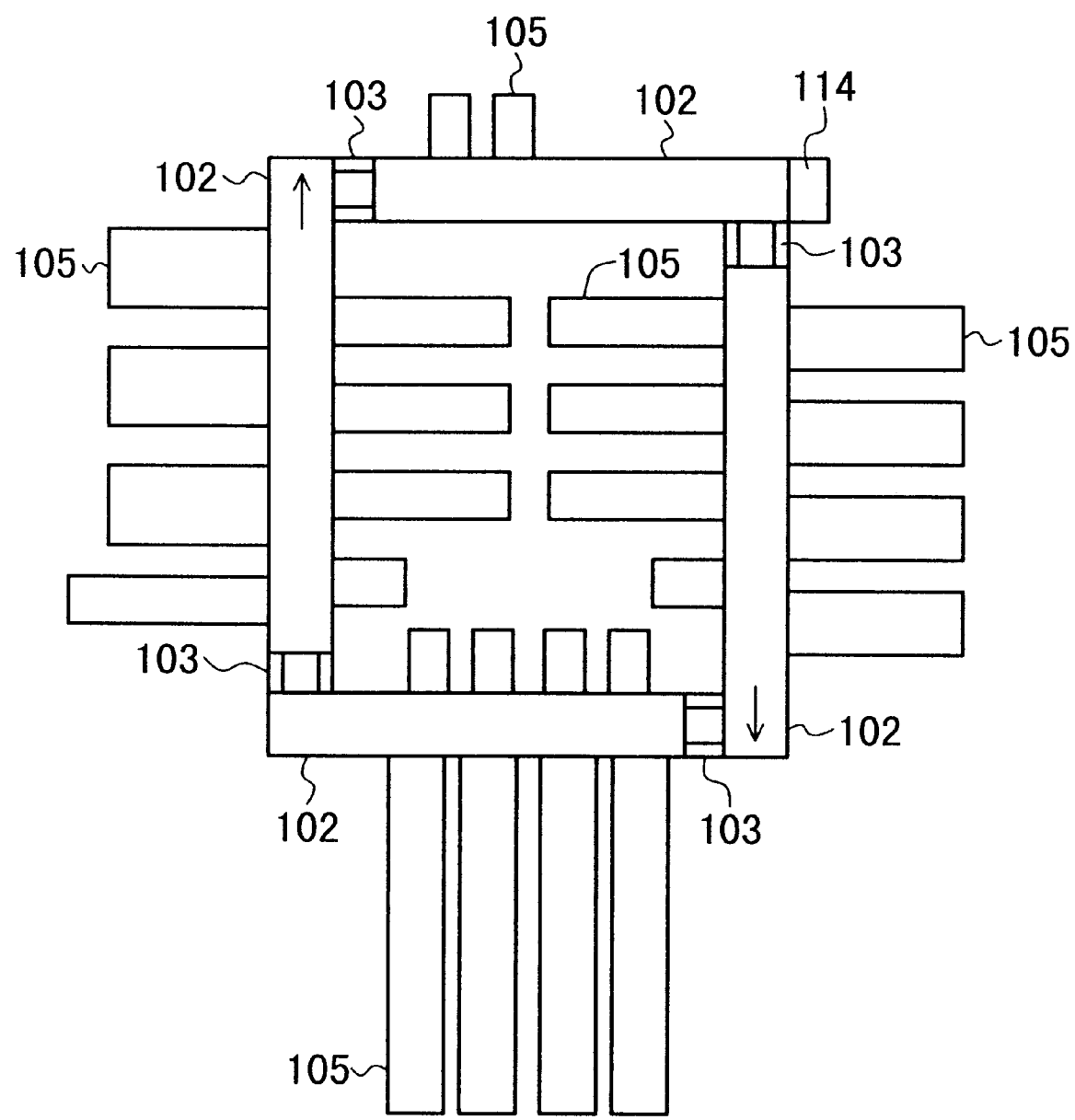
FIG. 14 is a schematic plan view of a transport apparatus according to a sixth embodiment of the invention.

FIG. 14 is a schematic plan view of a transport apparatus according to a sixth embodiment. In the fifth embodiment shown in FIG. 9, all the stockers 102 are connected directly to one main stocker 101. In the sixth embodiment, a plurality of stockers 102 are connected in a ring shape. Each component of the sixth embodiment shown in FIG. 14 is given an identical reference numeral to that of a corresponding component of the fifth embodiment shown in FIG. 9.

For example, one turn of the stockers 102 disposed in a ring shape completes the processes of forming one layer including a film forming process, a photolithography process, an etching process and an inspection process. By repeating the one-layer processes five to six times, all the processes for a single substrate can be completed.

Figure 15A:
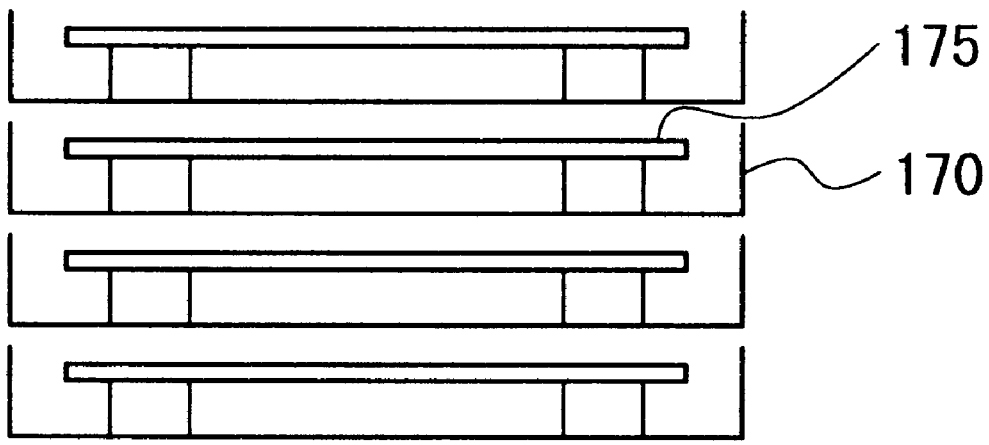
FIGS. 15A and 15B are cross sectional views of a tray and a cassette for holding a workpiece to be transferred by the embodiment transport apparatus, respectively.

FIG. 15A shows a tray for holding a substrate to be processed and transported in the transport apparatus. A plurality of trays 170 are stacked and a substrate 175 to be processed is placed on each tray. These stacked trays 170 are transported as one unit.

Figure 15B:
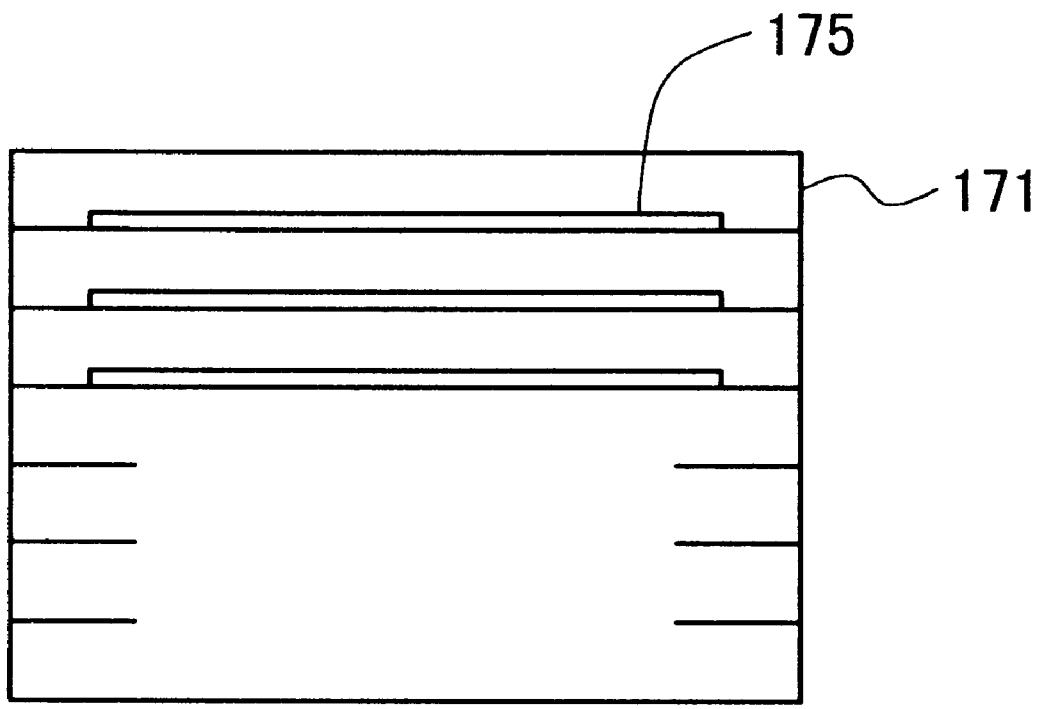

FIG. 15B shows a cassette to be transported in the transport apparatus. A plurality of substrates 175 are placed on one cassette 171. This cassette 171 is transported in the transport apparatus as one unit.

Figure 16:
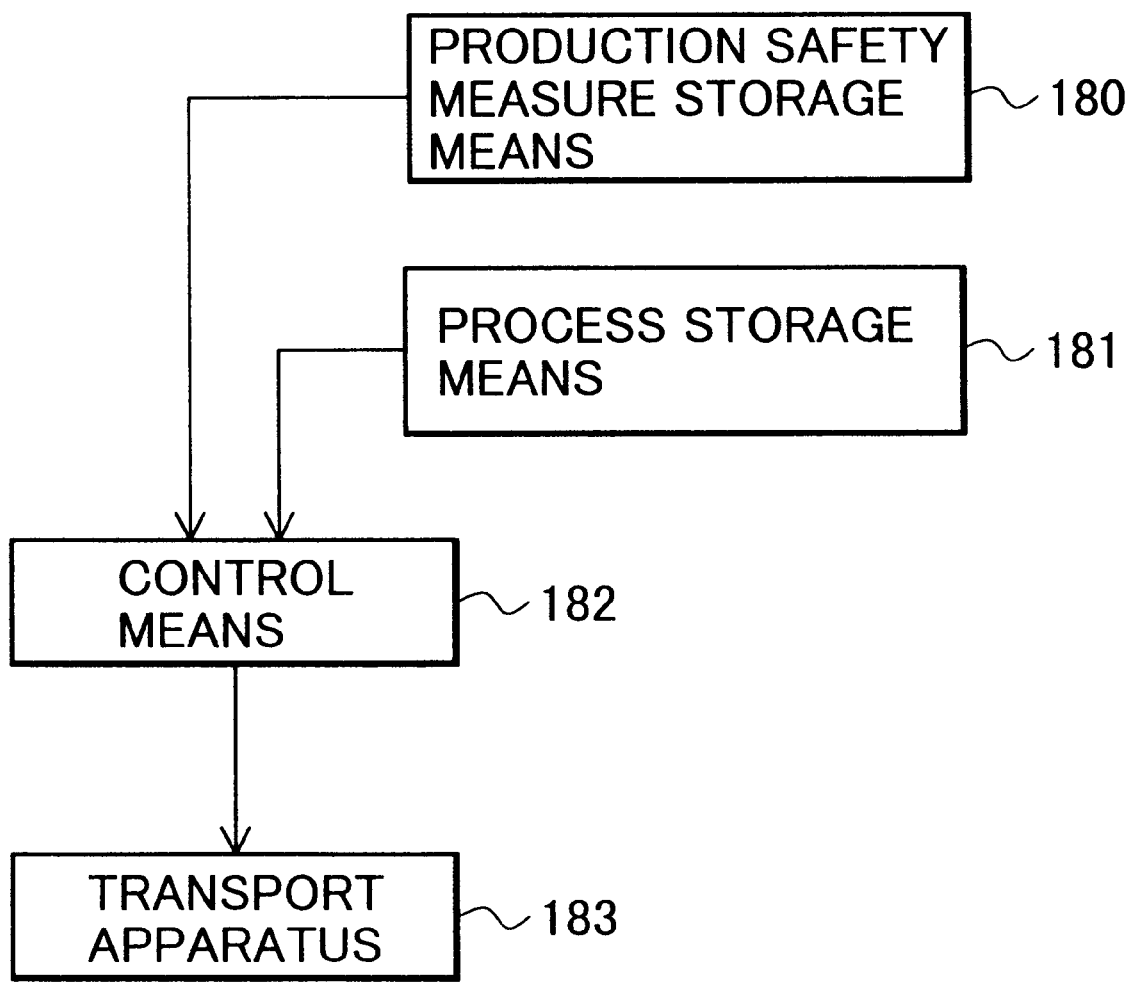
FIG. 16 is a block diagram illustrating a transport sequence of the embodiment transport apparatus.

With reference to FIGS. 9 and 16, the transport processes for a workpiece will be described. A production safety measure storage means 180 classifies a plurality of processing apparatuses into apparatus groups each performing the same process, and stores information on whether each apparatus group is provided with a production safety measure. A process storage means 181 stores the order of apparatus groups which sequentially process a workpiece. A control means 182 controls a transport means 183 to transport a workpiece in accordance with the order stored in the process storage means 181.

If a workpiece is transferred from the transfer storage site of a first apparatus group provided with the production safety measure to the transfer storage site of a second apparatus group which executes the next process, the workpiece is once transported to the stock storage site. Since the workpiece is temporarily stored in the stock storage site, the workpiece can be reliably transported to the second apparatus group even if the first apparatus group becomes defective and its process ability lowers.

If a workpiece is transferred from the transfer storage site of a third apparatus group not provided with the production safety measure to the transfer storage site of a fourth apparatus group which executes the next process, the workpiece is directly transported to the next transfer storage site without stocking it in the stock storage site.

The following case is considered. In the case, the process storage means 181 stores an order of the apparatus groups. A workpiece is supposed to be processed in the order of a first apparatus group with the production safety measure, a second apparatus group without the production safety measure, a third apparatus group with the production safety measure. There may be a plurality of apparatus groups without the production safety measure other than the second apparatus group between the first apparatus group and the third apparatus group. When a workpiece is sequentially transferred from a transfer storage site to another transfer storage site corresponding to the apparatus groups between the first apparatus group and the third apparatus group, transport between the transfer storage sites of the downstream apparatus groups is preferentially executed over transport between the transfer storage sites of the upstream apparatus groups. By preferentially transporting a workpiece at the later process, it is possible to prevent interference loss and under-production clogging.

The present invention has been described in connection with the preferred embodiments. The invention is not limited only to the above embodiments. It is apparent that various modifications, improvements, combinations, and the like can be made by those skilled in the art.

What is claimed is:

1. A transport apparatus comprising:
   a first main transport path for transporting a workpiece;
   a plurality of first subsidiary transport paths disposed crossing said first main transport path, said first subsidiary transport path transporting the workpiece;
   a first stocker disposed at each cross point between said first main transport path and each of said first subsidiary transport paths, said first stocker transferring the workpiece to and from said first main transport path and a corresponding first subsidiary transport path and temporarily stocking the workpiece; and a plurality of first processing apparatuses disposed corresponding to each of said first subsidiary transport paths, said first processing apparatus receiving the workpiece transported on a corresponding first subsidiary transport path, processing the workpiece, and returning the workpiece to the corresponding first subsidiary transport path.

2. A transport apparatus according to claim 1, wherein a plurality of first stockers are disposed at each cross point between said first main transport path and each of said first subsidiary transport paths.

3. A transport apparatus according to claim 1, wherein at least some of the first stockers transfer the workpiece to and from another first subsidiary transport path adjacent to the corresponding first subsidiary transport path.

4. A transport apparatus according to claim 1, wherein said first main transport path includes an outward path, a return path disposed in parallel to the outward path, a first curve path interconnecting an end of the outward path and a start of the return path, and a second curved path interconnecting an end of the return path and a start of the outward path.

5. A transport method using a transport apparatus comprising:

a first main transport path for transporting a workpiece;

a plurality of first subsidiary transport paths disposed crossing said first main transport path, said first subsidiary transport path transporting the workpiece;

a first stocker disposed at each cross point between said first main transport path and each of said first subsidiary transport paths, said first stocker transferring the workpiece to and from said first main transport path and a corresponding first subsidiary transport path and temporarily stocking the workpiece; and a plurality of first processing apparatuses disposed corresponding to each of said first subsidiary transport paths, said first processing apparatus receiving the workpiece transported on a corresponding first subsidiary transport path, processing the workpiece, and returning the workpiece to the corresponding first subsidiary transport path, the method comprising the steps of:

managing one or a plurality of first stockers corresponding to a same first subsidiary transport path as a first stocker group and storing an allowable vacant number which is the number of workpieces capable of being stocked in each of the first stockers belonging to the first stocker group, subtracted by the number of workpiece presently in stock; and determining from the stored allowable vacant number whether the workpiece can be transported from one stocker group to another stocker group.

6. A transport method according to claim 5, further comprising the steps of:

storing an under-production number which is a sum of the number of workpieces under transport on each of said first subsidiary transport paths and the number of workpieces in said first processing apparatus connected to the first subsidiary transport path; and determining from the stored under-production number whether the workpiece can be transported from one stocker group to another stocker group.

7. A transport method according to claim 5, further comprising a step of:

determining from the allowable vacant number of the first stocker group at a next transport destination of the workpiece in said first stocker, whether the workpiece is transported or continuously stocked in said first stocker.

8. A transport system comprising:

a first main transport path for transporting a workpiece;

a plurality of first subsidiary transport paths disposed crossing said first main transport path, said first subsidiary transport path transporting the workpiece;

a first stocker disposed at each cross point between said first main transport path and each of said first subsidiary transport paths, said first stocker transferring the workpiece to and from said first main transport path and a corresponding first subsidiary transport path and temporarily stocking the workpiece;

a plurality of first processing apparatuses disposed corresponding to each of said first subsidiary transport paths, said first processing apparatus receiving the workpiece transported on a corresponding first subsidiary transport path, processing the workpiece, and returning the workpiece to the corresponding first subsidiary transport path;

a building having a first floor and a second floor, said first main transport path, said plurality of first subsidiary transport paths, said plurality of first stockers and said plurality of first processing apparatuses being installed on the first flower;

a second main transport path, a plurality of second subsidiary transport paths, a plurality of second stockers and a plurality of second processing apparatuses, respectively installed on the second floor, each of said second subsidiary transport paths being disposed crossing said second main transport path, each of said plurality of second stockers being disposed at each cross point between said second main transport path and each of said second subsidiary transport paths, and transferring the workpiece to and from said second main transport path and a corresponding second subsidiary transport path, each of said plurality of second processing apparatuses disposed corresponding to one of said second subsidiary transport paths, said second processing apparatus receiving the workpiece transported on a corresponding second subsidiary transport path, processing the workpiece, and returning the workpiece to the corresponding second subsidiary transport path; and first inter-floor transport means for transporting the workpiece between one of said first main transport path, said plurality of first subsidiary transport paths and said plurality of first stockers and one of said second main transport path, said plurality of second subsidiary transport paths and said plurality of second stockers.

9. A transport system according to claim 8, wherein:

said first main transport path is disposed along a first virtual line having opposite ends;

said second main transport path is disposed along a second virtual line having opposite ends;

said first inter-floor transport means transfers the workpiece to and from said first subsidiary transport path disposed nearest to one end of said first main transport path or said first stocker assigned to the first subsidiary transport path, and transfers the workpiece to and from said second subsidiary transport path dispose nearest to one end of said second main transport path or said second stocker assigned to the second subsidiary transport path; and the transport system further comprises a second inter-floor transport means for transferring the workpiece to and from said first subsidiary transport path disposed nearest to another other end of said first main transport path or said first stocker assigned to the first subsidiary transport path, and transfers the workpiece to and from said second subsidiary transport path dispose nearest to another end of said second main transport path or said second stocker assigned to the second subsidiary transport path.

10. A transport apparatus comprising:

a plurality of transport paths for transporting a workpiece;

a stocker disposed in correspondence with each of said plurality of transport paths, said stocker transporting the workpiece to and from a corresponding transport path and temporarily stocking the workpiece;

a connection path interconnecting two stockers for transporting the workpiece between the two stockers, said connection path being disposed so that the workpiece in one stocker can be transported to all of other stockers via one or two or more of said connection path, said transport paths and said stockers; and a plurality of processing apparatuses disposed corresponding to each of said transport paths, said processing apparatus receiving the workpiece transported on a corresponding transport path, processing the workpiece, and returning the workpiece to the corresponding transport path.

11. A transport apparatus according to claim 10, wherein:

said plurality of transport paths cross a first virtual line having opposite ends at different points; and said stocker can transport the workpiece to and from another transport path adjacent to the corresponding transport path.

12. A transport apparatus according to claim 11, wherein:

at least one of said stockers is disposed on both sides of the first virtual line in correspondence with each of said transport paths; and said connection path serially connects said stocker disposed on one side of the first virtual line, serially connects said stocker disposed on another side, and connects said two stockers corresponding to each of said transport paths, overriding the first virtual line.

13. A transport apparatus according to claim 10, further comprising:

purifying means for purifying an inner space of said stocker more than an external space, wherein an inner space of said connection path is a hermetically sealed space which is separated from a space other than the space of said stocker.

14. A transport apparatus comprising:

a stocker for defining a space in which gas is circulated; and a plurality of processing apparatuses coupled to said stocker for processing a workpiece, wherein:

in said stocker, a plurality of stock storage sites for stocking the workpiece and a plurality of transfer storage sites provided for each of said processing apparatuses for transferring the workpiece to and from a corresponding processing apparatus are reserved, and said stocker having transport means in an inner space thereof for transporting the workpiece from the stock storage site to another stock storage site or the transfer storage site, or from the transfer storage site to another transfer storage site or the stock storage site; and each of said processing apparatuses receives the workpiece stored in a corresponding transfer storage site, processes the received workpiece, and return the processed workpiece to the corresponding transfer storage site.

15. A transport apparatus according to claim 14, wherein:

at least some of the plurality of stock storage sites and transfer storage sites are two-dimensionally disposed along a first virtual plane, the transport means is disposed on one side of the first virtual plane, the transport means transports the workpiece to and from the stock storage site and the transfer storage site via a front surface which is one side, relative to the first virtual plane, of the stock storage site and the transfer storage site disposed along the first virtual plane, a back surface being another side, said processing means transfers the workpiece to and from the transfer storage site via the back surface; and the transport apparatus further comprises a first air blowing path disposed at the stock storage site for flowing purified gas from the back surface thereof to the front surface.

16. A transport apparatus according to claim 15, wherein:

remaining others of the plurality of stock storage sites and transfer storage sites are two-dimensionally disposed along a second virtual plane facing a front surface side of the first virtual plane, the transport means transports the workpiece to and from the stock storage site and the transfer storage site disposed along the second virtual plane via a front surface which is one side of the stock storage site and the transfer storage site on a first virtual plane side, a back surface being another side, said processing means transfers the workpiece to and from the transfer storage site via the back surface.

17. A transport apparatus according to claim 15, further comprising a shutter capable of being opened and closed, the shutter being disposed on a front surface side of the transfer storage site and separating a space of the transfer storage site from a space of said stocker.

18. A transport apparatus according to claim 15, further comprising a second air blowing path for flowing purified gas into a space of the transfer storage site from a side surface or an upper surface interconnecting the front surface and back surfaces of the transfer storage site.

19. A transport apparatus according to claim 18, further comprising an ionizer for ionizing gas supplied from the second air blowing path to the space of the transfer storage site.

20. A transport apparatus according to claim 18, wherein the first air blowing path includes a third air blowing path and a fourth air blowing path, the third air blowing path is disposed along a back of the stock storage site and supplies gas from a downstream end to the second air blowing path, the fourth air blowing path is not connected to the second air blowing path, and the third air blowing path has a wider gas flow section than the fourth air blowing path.

21. A transport apparatus according to claim 15, wherein said stocker includes a plurality of units disposed along a first direction along the first virtual plane, and the units are classified into stock-only units reserving only the stock storage site among the stock storage site and the transfer storage site and transfer enabled units reserving both the stock storage site and the transfer storage site.

22. A transport apparatus according to claim 21, wherein a width of the stock-only unit along the first direction is equal to a width of the transfer enabled unit along the first direction, and the stock-only unit can be replaced in position by the transfer enabled unit.

23. A transport apparatus according to claim 15, further comprising:
   a return duct whose first end is connected to the space of said stocker and whose second end is connected to the first air blowing path; and
   an air blowing apparatus disposed at the first end for supplying gas in said stocker to the return duct,
   wherein the first air blowing path transports the gas introduced to the return duct to a back of the stock storage site.

24. A transport apparatus according to claim 23, further comprising a gas mixing unit inserted between a connection portion between the return duct and the first air blowing path, the gas mixing unit transports gas supplied from the return duct to the first air blowing path via a gas purifying filter.

25. A transport apparatus according to claim 14, wherein said processing apparatus comprises:
   a robot chamber connected to a back of a corresponding transfer storage site for defining a space communicating with a space of the transfer storage site;
   a processing chamber connected to the robot chamber;
   a transport robot disposed in the robot chamber for transporting the workpiece between the transfer storage site and the processing chamber; and
   a robot chamber air blowing path for supplying purified gas to the robot chamber.

26. A transport apparatus according to claim 25, further comprising a separation plate capable of separating the robot chamber from the space of the transfer storage site.

27. A transport apparatus comprising:
   a plurality of stockers for defining a space in which gas is circulated;
   a plurality of processing apparatuses coupled to each of said stockers for processing a workpiece; and
   a connection path for connecting two stockers among said plurality of stockers, said connection path defining a space communicating with spaces of corresponding stockers and transferring the workpiece between the corresponding stockers,
   wherein:
      in said stocker, a plurality of ones of storage sites among a plurality of stock storage sites and a plurality of transfer storage sites are reserved, the stock storage site stocking the workpiece and the transfer storage site being provided for each of said processing apparatuses for transferring the workpiece to and from a corresponding processing apparatus, and said stocker having transport means provided in each of said connection paths for transporting the workpiece from one storage site among an in/out-stock storage site capable of transferring the workpiece to and from a corresponding connection path, the plurality of stock storage sites and transfer storage sites, to another storage site; and
      each of said processing apparatuses receives the workpiece stored in a corresponding transfer storage site, processes the received workpiece, and return the processed workpiece to the corresponding transfer storage site.

28. A transport apparatus according to claim 27, further comprising:
   a first air blowing path for supplying purified gas to a space of said connection path; and
   a first exhaust hole for exhausting the gas in the space of said connection path.

29. A transport apparatus according to claim 27, wherein a pressure in said stocker is controlled higher than a pressure in said connection path connected to said stocker.

30. A transport apparatus according to claim 27, wherein:
   in an inner space of at least one of said plurality of stockers, a transfer storage site is reserved for transferring the workpiece to and from a transport vehicle via a first transfer window capable of being opened and closed; and
   said stocker includes a shutter capable of being opened and closed for shielding a space in the transfer storage site from a space in said stocker and a second air blowing path for supplying purified gas to the transfer storage site.

31. A transport apparatus according to claim 30, wherein the second air blowing path flows gas toward the first transfer window from a side opposite to the first transfer window of the transfer storage site.

32. A transport apparatus according to claim 30, further comprising:
   a first air blowing apparatus for circulating gas in said stocker; and
   a second air blowing apparatus for supplying gas in the transfer storage site via the second air blowing path.

33. A transport apparatus according to claim 30, further comprising: a transport vehicle for transferring the workpiece to and from the transfer storage site, the transport vehicle comprises:
   a transport storage site for storing the workpiece;
   a second transfer window capable of being opened and closed for transferring the workpiece to and from the transfer storage site; and
   a second exhaust hole for exhausting gas flowed from the second transfer window and passed through the transfer storage site from an opposite side surface, the second exhaust hole being formed at the opposite side surface.

34. A transport apparatus according to claim 27, wherein one of said plurality of stockers is directly connected to each of all other stockers via said connection path.

35. A transport apparatus according to claim 27, wherein said plurality of stockers are connected via said connection path in a ring shape.

36. A transport apparatus according to claim 27, further comprising:
   production safety measure storage means for classifying said plurality of processing apparatuses in to apparatus groups each performing a same process and storing whether each of said processing apparatus is provided with a production safety measure;
   process storage means for storing an order of apparatus groups which process the workpiece; and
   control means for controlling said transport means to transfer the workpiece in accordance with the order stored in the process storage means,
   wherein the control means controls said transport means so that if the workpiece is transported from the transfer storage group provided wig to the apparatus group provided with the production safety measure to a next transfer storage site, the workpiece is once transferred to the stock storage site.

37. A transport apparatus according to claim 36, wherein the control means controls said transport means so that if the workpiece is transported from the transfer storage site corresponding to the apparatus group not provided with the production safety measure to a next transfer storage site, the workpiece is transferred directly to a next transfer storage site without stocking the workpiece in the stock storage site.

38. A transport apparatus according to claim 36, wherein when the workpiece is sequentially transported from one transfer storage site to the next transfer storage site, in correspondence to a process order of each apparatus group stored in the process storage means such as an order of an apparatus group with the production safety measure, another apparatus group without the production safety measure, and another apparatus group with the production safety measure, transport between the transfer storage sites of the downstream apparatus groups is preferentially executed over transport between the transfer storage sites of the upstream apparatus groups.

* * * * *